(12) United States Patent
Lee et al.

(10) Patent No.: US 11,165,262 B2
(45) Date of Patent: Nov. 2, 2021

(54) APPARATUS AND METHOD FOR PREVENTING OVERCHARGE

(71) Applicant: LG Chem, Ltd., Seoul (KR)

(72) Inventors: Jae-Chan Lee, Daejeon (KR); Soo-Ryoung Kim, Daejeon (KR); Hyun-Sik Kim, Daejeon (KR); Hyeon-Jin Song, Daejeon (KR); Won-Tae Lee, Daejeon (KR); Yang-Lim Choi, Daejeon (KR)

(73) Assignee: LG Chem, Ltd.

( * ) Notice: Subject to any disclaimer, the term of this patent is extended or adjusted under 35 U.S.C. 154(b) by 149 days.

(21) Appl. No.: 16/340,265

(22) PCT Filed: Feb. 12, 2018

(86) PCT No.: PCT/KR2018/001819
§ 371 (c)(1),
(2) Date: Apr. 8, 2019

(87) PCT Pub. No.: WO2018/194249
PCT Pub. Date: Oct. 25, 2018

(65) Prior Publication Data
US 2020/0044459 A1    Feb. 6, 2020

(30) Foreign Application Priority Data
Apr. 17, 2017   (KR) .................. 10-2017-0049372

(51) Int. Cl.
*H02J 7/00*   (2006.01)
(52) U.S. Cl.
CPC .......... *H02J 7/0016* (2013.01); *H02J 7/0026* (2013.01); *H02J 7/00036* (2020.01); *H02J 7/00302* (2020.01)

(58) Field of Classification Search
CPC ....... H02J 7/0016; H02J 7/0026; H02J 7/0036
See application file for complete search history.

(56) References Cited

U.S. PATENT DOCUMENTS 6,316,917 B1   11/2001   Ohta
7,352,155 B2    4/2008   Li et al.
(Continued)

FOREIGN PATENT DOCUMENTS

JP    2001339803 A   12/2001
JP    2005-192281 A   7/2005
(Continued)

OTHER PUBLICATIONS

Supplemental European Search Report for EP18787678 dated Sep. 26, 2019.
(Continued)

*Primary Examiner* — Robert Grant
(74) *Attorney, Agent, or Firm* — Lerner, David, Littenberg, Krumholz & Mentlik, LLP

(57) ABSTRACT

An apparatus and method for protecting each of a plurality of cell stacks included in a battery pack from overcharge. The overcharge prevention apparatus prevents the overcharge of a plurality of cell stacks connected in series within a high current path. The overcharge prevention apparatus includes a voltage measuring unit configured to measure voltage of each cell stack, and generate a first monitoring signal indicating the measured voltage, a current regulating unit configured to selectively provide a bypass path to each cell stack, and a controller connected to the voltage measuring unit and the current regulating unit allowing communication. The controller is configured to control the current regulating unit based on the first monitoring signal from the voltage measuring unit.

17 Claims, 17 Drawing Sheets

(56) References Cited

U.S. PATENT DOCUMENTS

| | | |
|---|---|---|
| 8,485,293 B2 | 7/2013 | Wagner |
| 9,793,734 B2 * | 10/2017 | Brisebois ................ B60L 58/18 |
| 2009/0167248 A1 | 7/2009 | Murao et al. |
| 2010/0237829 A1 | 9/2010 | Tatebayashi et al. |
| 2011/0298463 A1 * | 12/2011 | Saito .................... H02J 7/0026 |
| | | 324/426 |
| 2012/0133329 A1 | 5/2012 | Yoshida et al. |
| 2013/0009600 A1 | 1/2013 | Jeong et al. |
| 2013/0249317 A1 | 9/2013 | Kang et al. |
| 2014/0030557 A1 | 1/2014 | Kim |
| 2017/0015205 A1 | 1/2017 | Ahn et al. |

FOREIGN PATENT DOCUMENTS

| | | |
|---|---|---|
| JP | 2007-305451 A | 11/2007 |
| JP | 2008010295 A | 1/2008 |
| JP | 2008123868 A | 5/2008 |
| JP | 2008288109 A | 11/2008 |
| JP | 2011101517 A | 5/2011 |
| JP | 2012244812 A | 12/2012 |
| JP | 2013146159 A | 7/2013 |
| JP | 2014507921 A | 3/2014 |
| JP | 2015119605 A | 6/2015 |
| KR | 20060078967 A | 7/2006 |
| KR | 20100015998 A | 2/2010 |
| KR | 10-1073196 B1 | 10/2011 |
| KR | 2011-0133433 A | 12/2011 |
| KR | 20120022394 A | 3/2012 |
| KR | 101317270 B1 | 10/2013 |
| KR | 20140017043 A | 2/2014 |
| KR | 101584322 B | 1/2016 |
| KR | 101584322 B1 | 1/2016 |
| KR | 20160080801 A | 7/2016 |
| KR | 101707150 B | 2/2017 |
| KR | 101707150 B1 | 2/2017 |
| KR | 20170011149 A | 2/2017 |

OTHER PUBLICATIONS

International Search Report dated May 21, 2018 for PCT/KR2018/001819, 2 pages.

* cited by examiner

APPARATUS AND METHOD FOR PREVENTING OVERCHARGE

CROSS-REFERENCE TO RELATED APPLICATIONS

The present application is a national phase entry under 35 U.S.C. § 371 of International Application No. PCT/KR2018/001819 filed Feb. 12, 2018, published in Korean, which claims priority from KR 10-2017-0049372 filed Apr. 17, 2017, all of which are incorporated herein by reference.

TECHNICAL FIELD

The present disclosure relates to an apparatus and method for preventing overcharge, and more particularly, to an apparatus and method for protecting each of a plurality of cell stacks included in a battery pack from overcharge.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries are gaining attention due to advantages of charging and discharging freely in the absence of a memory effect, a very low self-discharge rate, and high energy density as compared to nickel-based batteries.

It is general that a battery pack mounted in electric vehicles includes a plurality of cell stacks connected in series or in parallel. In this instance, each cell stack includes one battery cell or two or more battery cells connected in series.

The state of each cell stack included in the battery pack is monitored by a controller having a battery management system (BMS) mounted thereon. The controller may output signals for controlling the balancing operation, cooling operation, charging operation and discharging operation based on the monitored state from each cell stack.

As the charge current is supplied to the battery pack, voltage of each cell stack gradually increases, resulting in overcharge. Due to overcharge, a dangerous situation such as an explosion of the cell stack may take place, and there is prior art for preventing the overcharge, for example, Korean Patent Publication No. 10-2014-0017043. A battery pack according to the Korean patent publication includes a battery (corresponding to the cell stack) and a current breaking device, and when overvoltage occurs in the battery, the current breaking device electrically separates the battery from a high current path.

However, when the battery is simply electrically separated from the high current path in the event that the battery is overcharged, a grave problem may occur. For example, when the battery of the battery pack mounted in the electric vehicle is electrically separated from the high current path, there is a risk that the electric vehicle suddenly will stop.

DISCLOSURE

Technical Problem

The present disclosure is designed to solve the above-described problem, and therefore, the present disclosure is directed to providing an apparatus and method in which when a certain cell stack included in a battery pack is overcharged, the charge current is supplied to the remaining cell stack while bypassing the overcharged cell stack.

These and other objects and advantages of the present disclosure will be understood by the following description and will be apparent from the embodiments of the present disclosure. Further, it will be readily understood that the objects and advantages of the present disclosure are realized by the means set forth in the appended claims and combinations thereof.

Technical Solution

Various embodiments of the present disclosure for achieving the above-described object are as follows.

An overcharge prevention apparatus according to an aspect of the present disclosure is for preventing the overcharge of a plurality of cell stacks connected in series within a high current path. The overcharge prevention apparatus includes a voltage measuring unit configured to measure voltage of each cell stack and generate a first monitoring signal indicating the measured voltage, a current regulating unit configured to selectively provide a bypass path to each cell stack, and a controller connected to the voltage measuring unit and the current regulating unit allowing communication. The controller is configured to control the current regulating unit based on the first monitoring signal from the voltage measuring unit.

Additionally, the controller may be configured to determine if any of the plurality of cell stacks is overcharged, based on the first monitoring signal from the voltage measuring unit, and when there is an overcharged cell stack, control the current regulating unit to provide a bypass path to the overcharged cell stack.

Additionally, the current regulating unit includes a plurality of bypass circuits. Each bypass circuit may include a plurality of bypass switches connected in parallel to each cell stack.

Additionally, the controller may be configured to determine if any of the plurality of cell stacks is overcharged, based on the first monitoring signal from the voltage measuring unit, and when there is an overcharged cell stack, control at least one of the plurality of bypass switches connected in parallel to the overcharged cell stack into ON state.

Additionally, the overcharge prevention apparatus may further include a current measuring unit configured to measure a charge current supplied to each cell stack, and generate a second monitoring signal indicating the measured charge current.

Additionally, the controller may be configured to calculate an internal resistance value of at least one of the plurality of cell stacks based on the first monitoring signal from the voltage measuring unit and the second monitoring signal from the current measuring unit.

Additionally, the controller may be configured to control a number of bypass switches corresponding to the internal resistance value of the overcharged cell stack into ON state and remaining bypass switch into OFF state, among the plurality of bypass switches connected in parallel to the overcharged cell stack.

Additionally, the overcharge prevention apparatus may further include a cooling unit configured to cool each cell stack. The cooling unit may include a plurality of cooling elements, each operating by the charge current supplied through the bypass path provided to each cell stack to cool each cell stack.

Additionally, each cooling element may be a Peltier element having a heat absorbing part and a heat emitting part, the heat absorbing part being placed closer to each cell stack than the heat emitting part.

Additionally, the voltage measuring unit may include a plurality of voltage sensors, each connected in parallel to each cell stack.

A battery pack according to another aspect of the present disclosure includes the overcharge prevention apparatus, and a plurality of cell stacks connected in series. The overcharge prevention apparatus performs an overcharge prevention operation for each cell stack.

Advantageous Effects

According to the embodiments of the present disclosure, when any of a plurality of cell stacks included in the battery pack is overcharged, at least part of charge current is supplied to remaining cell stack while bypassing each overcharged cell stack. Accordingly, even though a certain cell stack is in overcharge state, the remaining cell stacks that are not overcharged can be continuously charged.

Additionally, among the plurality of cell stacks included in the battery pack, the overcharged cell stack may be electrically separated from a high current path. In this instance, instead of each cell stack electrically separated from the high current path, bypass paths that constitute the high current path are provided into the battery pack. Accordingly, even though any cell stack is electrically separated from the high current path, the remaining cell stacks that are not overcharged can be charged/discharged.

Additionally, instead of each cell stack electrically separated from the high current path, the resistance value of each bypass path that constitutes the high current path can be adjusted. In this case, the resistance value of each bypass path is adjusted according to the internal resistance value of each cell stack electrically separated from the high current path, to prevent the overcurrent supply to each cell stack staying in electrical connection to the high current path.

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide further understanding of the technical aspects of the present disclosure, and thus, the present disclosure is not construed as being limited to the statements set forth in the drawings.

MODE FOR CARRYING OUT THE INVENTION

Figure 1:
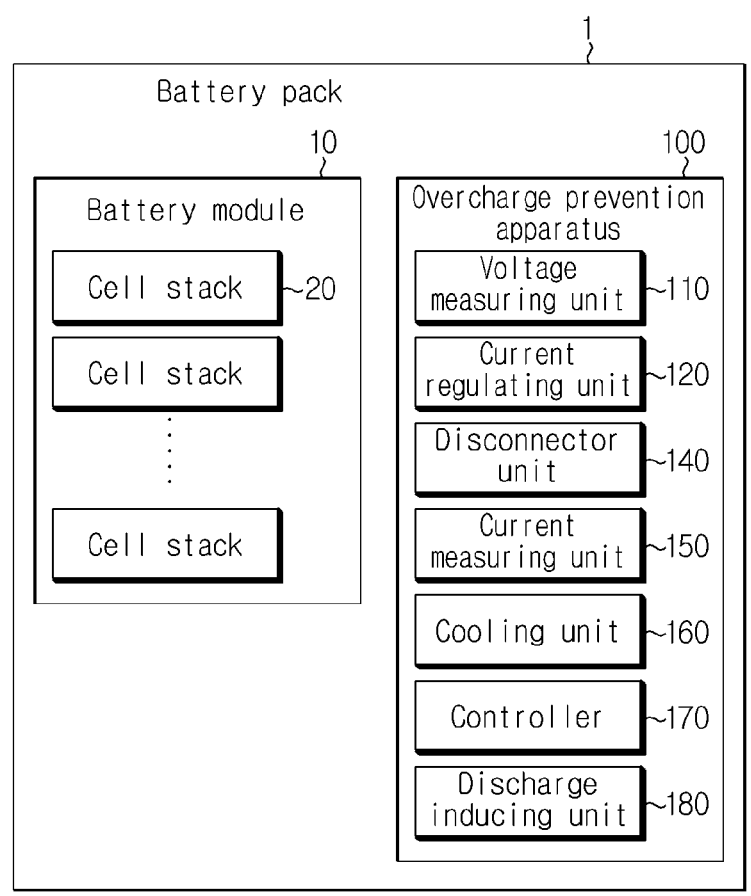
FIG. 1 is a diagram showing a schematic configuration of a battery pack according to an embodiment of the present disclosure.

Hereinafter, preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit>as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

FIG. 1 is a diagram showing a schematic configuration of a battery pack 1 according to an embodiment of the present disclosure.

Referring to FIG. 1, the battery pack 1 includes a battery module 10 and an overcharge prevention apparatus 100. The battery module 10 includes a plurality of cell stacks 20. The overcharge prevention apparatus 100 basically includes a voltage measuring unit 110, a current regulating unit 120 and a controller 170, and optionally may further include at least one of a disconnecting unit 140, a current measuring unit 150 and a cooling unit 160. Additionally, when the overcharge prevention apparatus 100 includes the disconnecting unit 140, a discharge inducing unit 180 may be added.

The plurality of cell stacks 20 is connected in series and is installed on a high current path between two power terminals of the battery pack 1.

The voltage measuring unit 110 measures the voltage of each cell stack 20, and generates a first monitoring signal indicating the measured voltage. The first monitoring signal generated by the voltage measuring unit 110 is transmitted to the controller 170.

The current regulating unit 120 is configured to selectively provide each cell stack 20 with bypass paths connected in parallel. That is, the current regulating unit 120 may provide bypass paths individually to the plurality of cell stacks 20. That is, the current regulating unit 120 may provide a bypass path to only part of the cell stacks 20, and may not provide a bypass path to the remaining cell stack 20.

An entirety or part of the charge current flows through each bypass path. Accordingly, while the charge current is supplied to the battery pack 1, the cell stack 20 provided with the bypass path stops charging or is charged very slowly.

Additionally, the current regulating unit 120 may adjust the resistance value of each bypass path. Accordingly, the current flowing through each bypass path is adjusted according to the resistance value of each bypass path. For example, as the resistance value of the bypass path increases, the charge current flowing through the bypass path may be reduced.

The disconnecting unit 140 is configured to selectively separate each cell stack 20 from the battery pack 1. That is, the disconnecting unit 140 electrically separates each stack 20 from the high current path. By the controller 170, the current regulating unit 120 and the disconnecting unit 140 may work together. For example, when any one cell stack 20 is separated from the high current path by the disconnecting unit 140, the current regulating unit 120 may provide a bypass path only to the separated cell stack 20. The bypass path provided to the separated cell stack 20 constitutes the high current path instead of the separated cell stack 20.

The current measuring unit 150 measures the charge current supplied to each cell stack 20, and generates a second monitoring signal indicating the measured charge current. The second monitoring signal generated by the current measuring unit 150 is transmitted to the controller 170. The current measuring unit 150 includes a shunt resistor installed on the high current path, and may measure the charge current from the voltage occurred across the shunt resistor by the charge current.

The cooling unit 160 is configured to individually cool the plurality of cell stacks 20. More specifically, the cooling unit 160 is activated at least in part by the charge current flowing through the bypass path provided to each cell stack 20. The activated cooling unit 160 cools a predetermined range of areas.

The discharge inducing unit 180 is configured to provide the discharge path to each cell stack 20 electrically separated from the high current path by the disconnecting unit 140 while the charge current is supplied through two power terminals of the battery pack 1. The discharge inducing unit 180 may be configured to be activated in response to the charge current flowing through the bypass path provided by the disconnecting unit 140.

The controller 170 may be implemented, in hardware, using at least one of application specific integrated circuits (ASICs), DSPs (digital signal processors), digital signal processing devices (DSPDs), programmable logic devices (PLDs), field programmable gate arrays (FPGAs), microprocessors, and electrical units for performing other functions. The controller 170 is connected to the current regulating unit 120, the voltage measuring unit 110, the current measuring unit 150 and/or the cooling unit 160 allowing communication, to control the entire operation of them. Here, the connection of two different elements to allow communication may refer to wired and/or wireless connection to allow one element to transmit signals or data to another.

The controller 170 is configured to perform an overcharge prevention operation for the plurality of cell stacks 20. Particularly, the controller 170 controls the current regulating unit 120 based on the first monitoring signal from the voltage measuring unit 110 and/or the second monitoring signal from the current measuring unit 150. According to the control signal from the controller 170, the current regulating unit 120 may provide a bypass path to each cell stack 20, or block the already provided bypass path. Additionally, the controller 170 may control the current regulating unit 120 to adjust the resistance value of each bypass path provided to at least one cell stack 20 within a predetermined range.

Hereinafter, to help understanding, assume that three cell stacks 20-1~20-3 connected in series are included in the battery pack 1.

Figure 2:
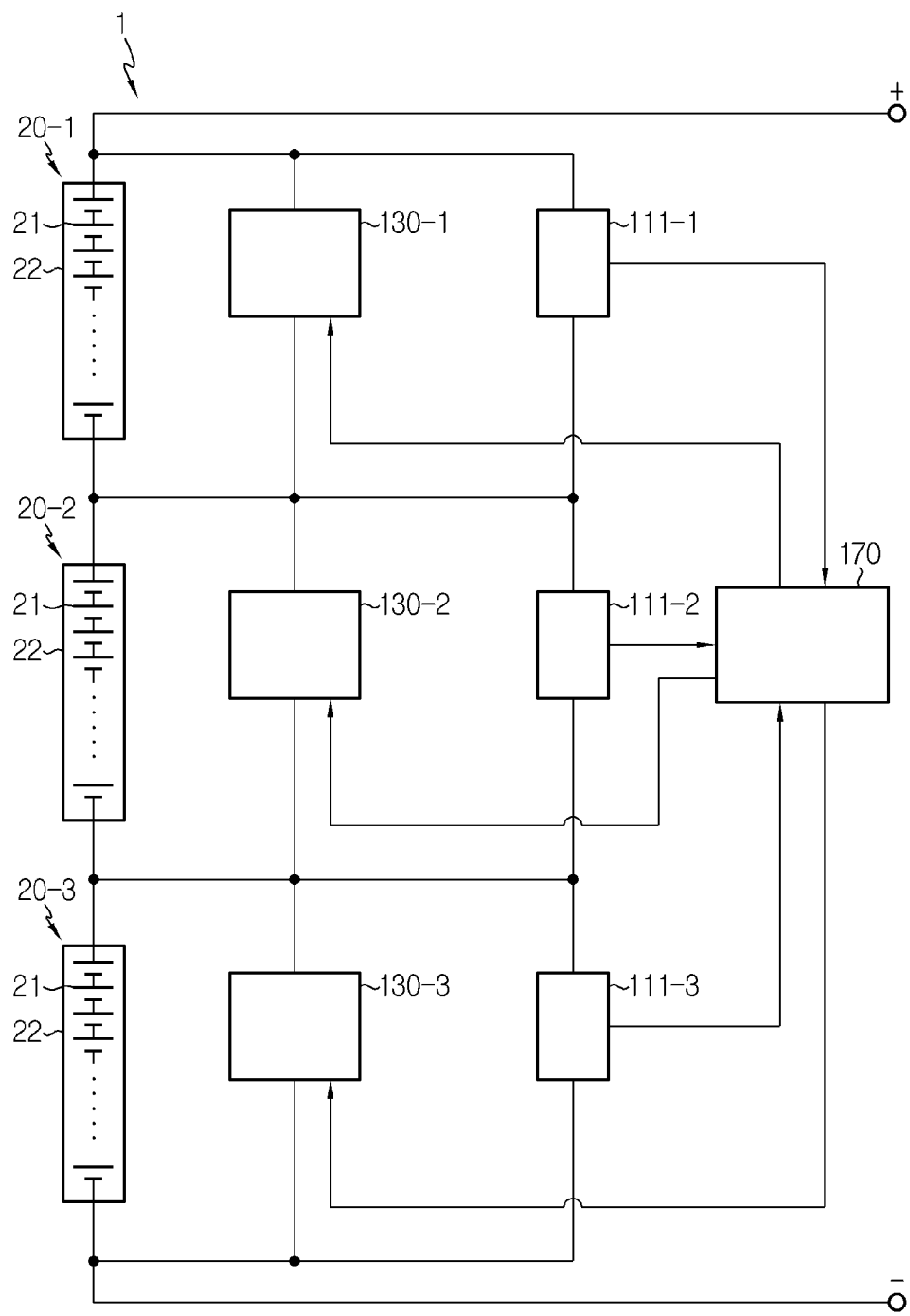
FIG. 2 shows one implementation example of the battery pack shown in FIG. 1.

FIG. 2 shows one implementation example of the battery pack 1 shown in FIG. 1.

The plurality of cell stacks 20 included in the battery pack 1 is installed on the high current path between two power terminals (+,−) of the battery pack 1.

Referring to FIGS. 1 and 2, each cell stack 20 includes at least one battery cell 21. When a plurality of battery cells 21 is included in each cell stack 20, they may be connected in series or in parallel. Additionally, each cell stack 20 may include a case 22 having a structure that at least partially covers each battery cell 21 included therein. The case 22 may be made of a metal material to achieve efficient heat emission.

The voltage measuring unit 110 may include a plurality of voltage sensors 111. The number of voltage sensors 111 may be the same as the number of cell stacks 20. In this case, each cell stack 20 may be provided with each voltage sensor 111. That is, the voltage sensors 111 may correspond to the cell stacks 20 one to one.

Each voltage sensor 111 is connected in parallel to each cell stack 20. That is, a first voltage sensor 111-1, a second voltage sensor 111-2 and a third voltage sensor 111-3 are respectively connected in parallel to a first cell stack 20-1, a second cell stack 20-2 and a third cell stack 20-3. Each voltage sensor 111 measures the voltage of any one cell stack 20 connected thereto in parallel. The first monitoring signal indicating the voltage of each cell stack 20 measured by the plurality of voltage sensors 111 is transmitted to the controller 170.

The current regulating unit 120 may include a plurality of bypass circuits 130-1~130-3. The number of bypass circuits 130 may be equal to the number of cell stacks 20. In this case, one bypass circuit 130 may be provided to each cell stack 20. That is, the bypass circuits 130 may correspond to the cell stacks 20 one to one.

Each bypass circuit 130 may be connected in parallel to each cell stack 20. That is, a first bypass circuit 130-1, a second bypass circuit 130-2 and a third bypass circuit 130-3 may be respectively connected in parallel to the first cell stack 20-1, the second cell stack 20-2 and the third cell stack 20-3.

When at least one of the plurality of bypass circuits 130-1~130-3 is activated by the controller 170, the activated bypass circuit 130 provides a bypass path to the cell stack 20 connected thereto in parallel.

The controller 170 determines if any of the plurality of cell stacks 20-1~20-3 is overcharged based on the first monitoring signal from the voltage measuring unit 110. Additionally, the controller 170 may calculate the number of overcharged cell stacks based on the first monitoring signal from the voltage measuring unit 110. To this end, the controller 170 compares the voltage measured from each cell stack 20 with a first reference voltage and/or a second reference voltage. In this instance, the second reference voltage is higher than the first reference voltage.

Each of the first reference voltage and the second reference voltage is used as a reference for determining if each cell stack 20 is overcharged. That is, the controller 170 determines that the cell stack 20 charged to the voltage that is equal to or higher than the first reference voltage is in overcharge state. Additionally, the controller 170 controls the current regulating unit 120 to supply only part of the charge current to the cell stack 20 charged to the voltage that is equal to or higher than the first reference voltage and lower than the second reference voltage. Hereinafter, a state of charge corresponding to the voltage that is equal to or higher than the first reference voltage and lower than the second reference voltage is referred to as a first overcharge state.

Additionally, the controller 170 controls the current regulating unit 120 and the disconnecting unit 140 to prevent the charge current supply to the cell stack 20 charged to the voltage that is equal to or higher than the second reference voltage. Hereinafter, a state of charge corresponding to the voltage that is equal to or higher than the second reference voltage is referred to as a second overcharge state.

Figure 3:
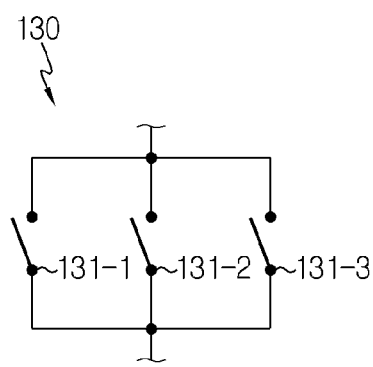
FIGS. 3 and 4 show different implementation examples of a bypass circuit shown in FIG. 2.
Figure 4:
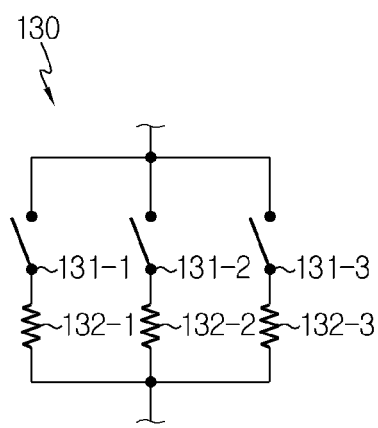

FIGS. 3 and 4 are diagrams showing different implementation examples of the bypass circuit 130 shown in FIG. 2.

First, referring to FIG. 3, each bypass circuit 130 shown in FIG. 2 may include one bypass switch 131 or two or more bypass switches 131 connected in parallel. Each bypass switch 131 includes any type of bypass switch capable of controlling ON/OFF switching in response to a signal from outside, such as relays or MOSFETs.

Although FIG. 3 shows that three bypass switches 131-1~131-3 are included in each bypass circuit 130, this is provided for illustration only, and two bypass switches 131 or four or more bypass switches 131 may be included in each bypass circuit 130. When at least one bypass switch 131 included in each bypass circuit 130 is in ON state, bypass paths are provided to the cell stacks 20 connected in parallel to each bypass circuit 130.

Each bypass switch 131 may have a predefined resistance value while in ON state. In this instance, the resistance values of the plurality of bypass switches 131-1~131-3 included in each bypass circuit 130 may be equal or different. The resistance values of the bypass paths are adjusted according to ON/OFF combination of each bypass switch 131.

Assume that first to third bypass switches 131-1~131-3 have the same resistance value R. While only one of the first to third bypass switches 131-1~131-3 is in ON state and the remaining bypass switches are in OFF state, the resistance value of the bypass path provided to the cell stack 20 is R. While any two of the first to third bypass switches 131-1~131-3 are in ON state and the remaining bypass switch is in OFF state, the resistance value of the bypass path provided to the first stack 20 is R/2. While the first to third bypass switches 131-1~131-3 are all in ON state, the resistance value of the bypass path provided to the cell stack 20 is R/3. That is, the larger the number of bypass switches 131 in ON state inside each bypass circuit 130, the smaller the resistance value of the bypass path provided to the cell stack 20 connected thereto in parallel.

Subsequently, referring to FIG. 4, when compared with FIG. 3, each bypass circuit 130 may further include one bypass resistor 132 or two or more bypass resistors 132. Each bypass resistor 132 is connected in series to any one of the plurality of bypass switches 131-1~131-3. That is, inside each bypass circuit 130, one bypass switch 131 and one bypass resistor 132 may be connected in series. In this instance, the resistance values of two or more bypass resistors 132 included in each bypass circuit 130 may be equal or different.

Assume that the first to third bypass switches 131-1~131-3 included in the first bypass circuit 130-1 corresponding to the first cell stack 20-1 have the same resistance value R, resistance values of a first bypass resistor 132-1, a second bypass resistor 132-2 and a third bypass resistor 132-3 are R1, R2, R3 respectively, and R1<R2<R3. While only the first bypass switch 131-1 included in the first bypass circuit 130-1 is in ON state, the resistance value of the bypass path provided to the first cell stack 20-1 is R+R1. While only the first and second bypass switches 131-1, 131-2 included in the first bypass circuit 130-1 are in ON state, the resistance value of the bypass path provided to the first cell stack 20-1 is $\{(R+R1)\times(R+R2)\}/\{(2\times R)+R1+R2\}$ by a combination of (R+R1) and (R+R2).

Meanwhile, each bypass circuit 130 previously described with reference to FIGS. 3 and 4 may be applied to the overcharge prevention apparatus 100 according to embodiments described below with reference to FIGS. 5 to 12.

Figure 5:
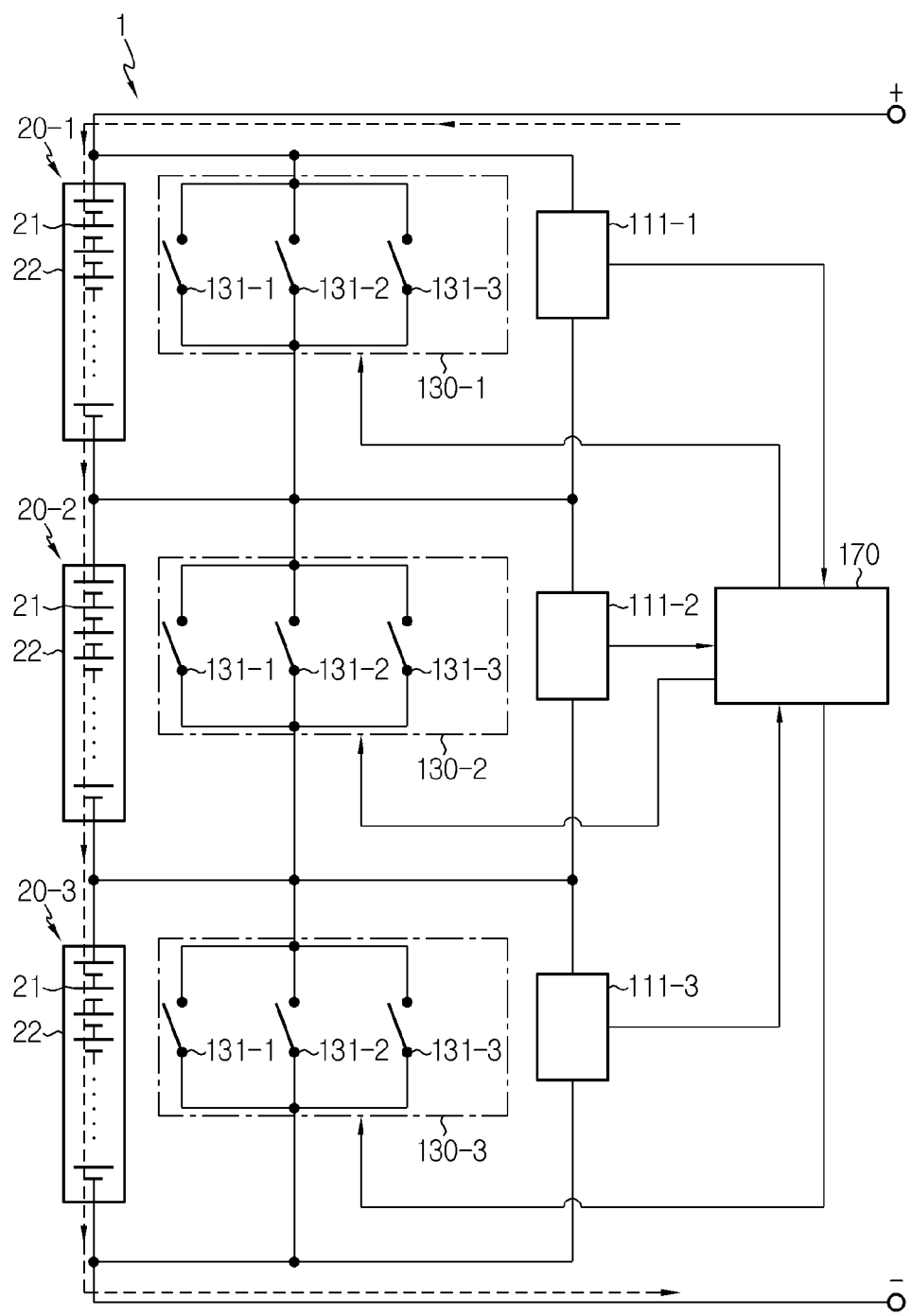
FIGS. 5 to 7 are diagrams for reference in describing the operation of an overcharge prevention apparatus according to the implementation example shown in FIG. 2.
Figure 6:
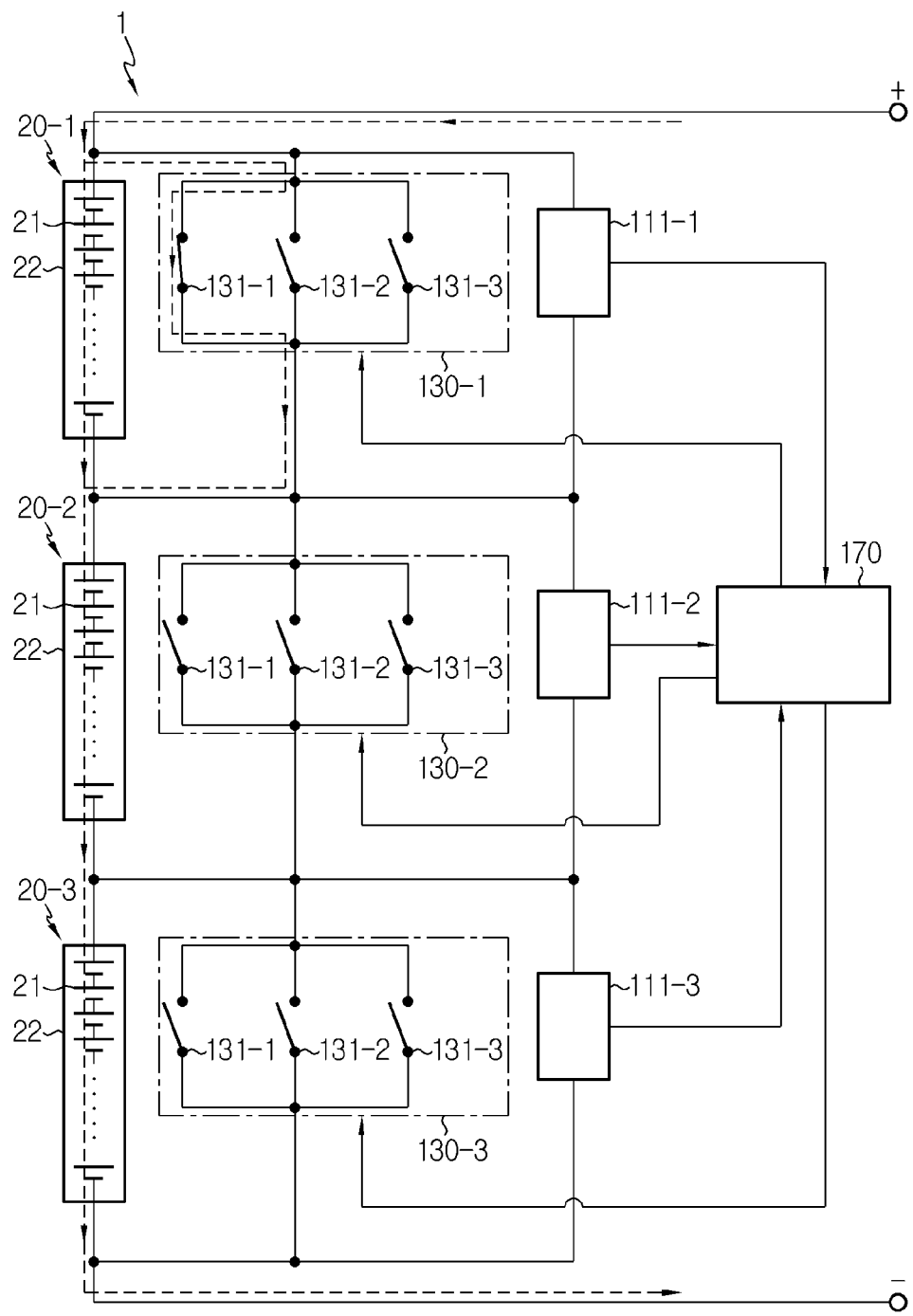
Figure 7:
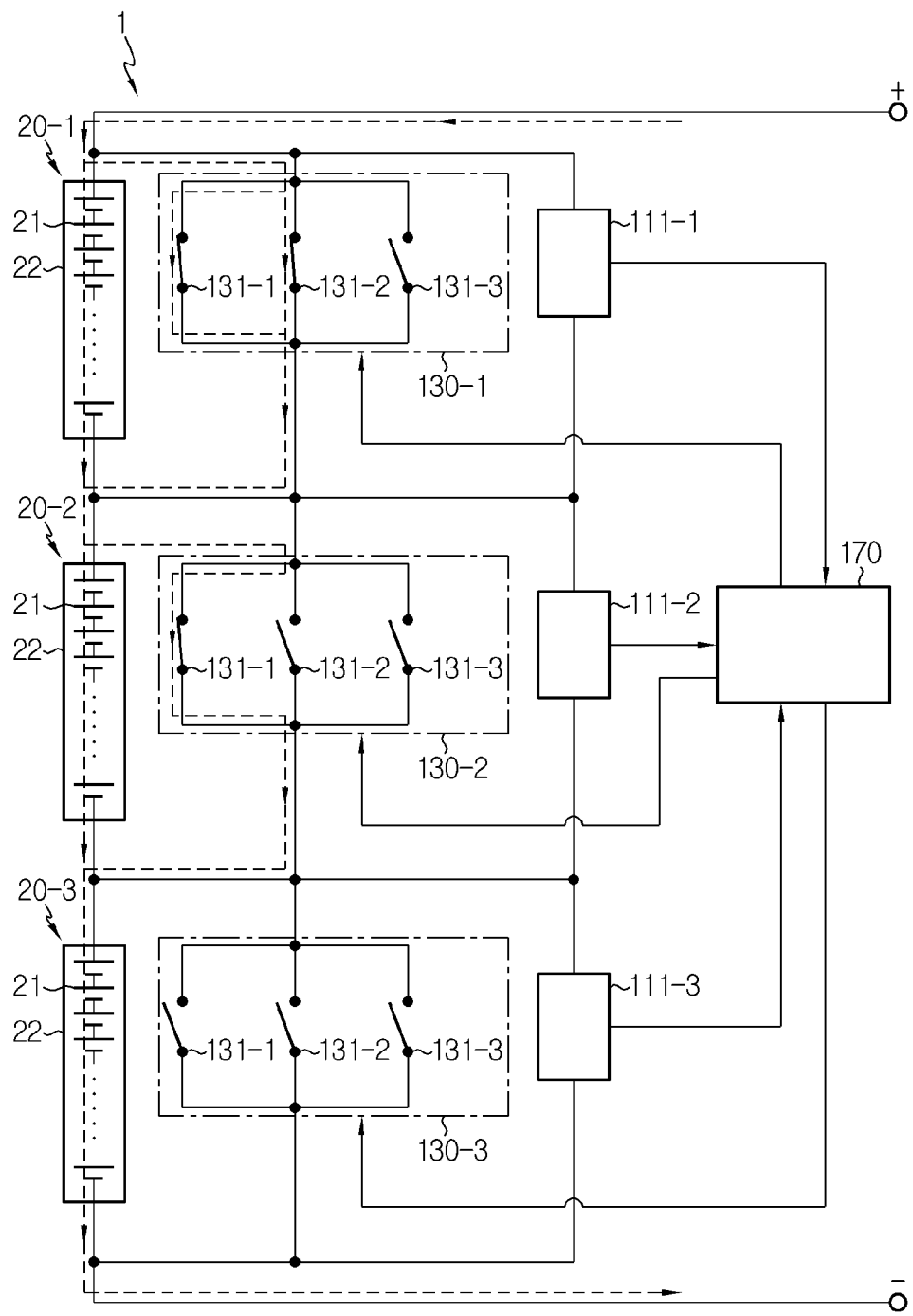

FIGS. 5 to 7 are diagrams for reference in describing the operation of the overcharge prevention apparatus according to the implementation example shown in FIG. 2. For convenience of description, assume that each bypass circuit 130 is configured as in FIG. 3, and all the bypass switches 131 have the same resistance value R.

First, FIG. 5 illustrates the operation when the first to third cell stacks 20-1~20-3 are not overcharged. In this case, the controller 170 controls the current regulating unit 120 to turn off all the bypass switches 131 of the first to third bypass circuits 130-1~130-3. Accordingly, any single bypass path is absent in the battery pack 1, and the charge current is supplied to each cell stack 20 in a sequential order.

Subsequently, FIG. 6 illustrates the operation when only the first cell stack 20-1 of the first to third cell stacks 20 is in first overcharge state. In this case, it is necessary to reduce the charge current supplied to the first cell stack 20-1. To this end, the controller 170 controls all the bypass switches 131 of the second and third bypass circuits 130-2, 130-3 into OFF state. Along with this, the controller 170 controls one or more bypass switches 131 of the first bypass circuit 130-1 into ON state.

When only one bypass switch 131-1 of the first bypass circuit 130-1 is controlled into ON state, the resistance value of the bypass path provided to the first cell stack 20-1 by the first bypass circuit 130-1 is R. Accordingly, part of the charge current supplied through the power terminal (+,−) of the battery pack 1 is supplied to the second and third cell stacks 20-2, 20-3 through the first cell stack 20-1, and the remaining charge current is supplied to the second and third cell stacks 20-2, 20-3 through the bypass path provided to the first cell stack 20-1. As a result, the first cell stack 20-1 is charged more slowly than the second and third cell stacks 20-2, 20-3.

Subsequently, FIG. 7 illustrates the operation when the first cell stack 20-1 is in second overcharge state and the second cell stack 20-2 is in first overcharge state. In this case, all the bypass switches 131-1~131-3 of the third bypass circuit 130-3 are maintained in OFF state by the controller 170. In contrast, the controller 170 controls one or more bypass switches 131 included in the second bypass circuit 130-2 into ON state. Along with this, the controller 170 controls such that the resistance value of the bypass path provided to the first cell stack 20-1 by the first bypass circuit 130-1 is smaller than R.

For example, as shown in FIG. 7, only one bypass switch 131-1 included in the second bypass circuit 130-2 is in ON state, and only two bypass switches 131-1, 131-2 included in the first bypass circuit 130-1 are in ON state. Accordingly, the resistance values of the two bypass paths provided by the first and second bypass circuit 130-1, 130-2 are R/2 and R respectively, and at least part of the charge current supplied to the battery pack 1 is supplied to the third cell stack 20-3 through the two bypass paths in a sequential order. As a result, the first and second cell stacks 20-1, 20-2 are charged more slowly than the third cell stack 20-3.

When compared with FIG. 6, the resistance value of the bypass path provided to the first cell stack 20-1 reduces from R to R/2, and the charge current supplied to the first cell stack 20-1 is lower than that of FIG. 6.

Figure 8:
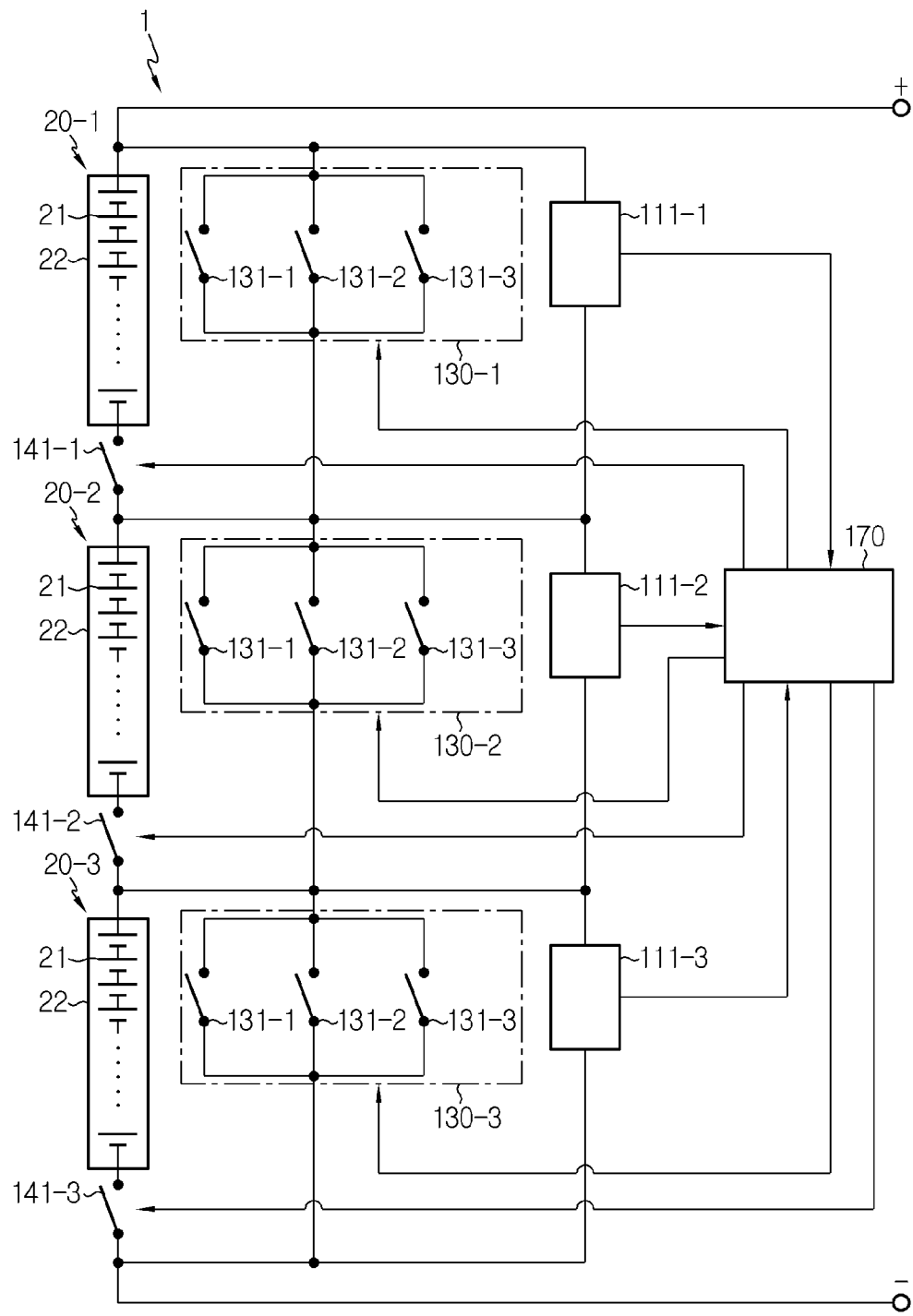
FIGS. 8 and 9 show different implementation examples of the battery pack shown in FIG. 1.

FIG. 8 shows another implementation example of the battery pack 1 shown in FIG. 1. When compared with the implementation example shown in FIG. 2, an only difference is that the overcharge prevention apparatus 100 according to the implementation example shown in FIG. 8 further includes the disconnecting unit 140. Accordingly, like reference numerals refer to like elements throughout, and a repeated description thereof is omitted herein.

Referring to FIGS. 1 and 8, the disconnecting unit 140 may include a plurality of disconnect switches 141. The number of disconnect switches 141 may be the same as the number of cell stacks 20. Each disconnect switch 141 includes any type of disconnect switch capable of controlling ON/OFF switching in response to a signal from outside, such as relays or MOSFETs. Each disconnect switch 141 is connected to each cell stack 20 in series, and is controlled into ON/OFF by the controller 170. A circuit having one cell stack 20 and one disconnect switch 141 connected in series is connected in parallel to each bypass circuit 130.

For example, as in FIG. 8, a first disconnect switch 141-1 is connected in series to the first cell stack 20-1, and the circuit having the first cell stack 20-1 and the first disconnect switch 141-1 connected in series is connected in parallel to the first bypass circuit 130-1.

Figure 9:
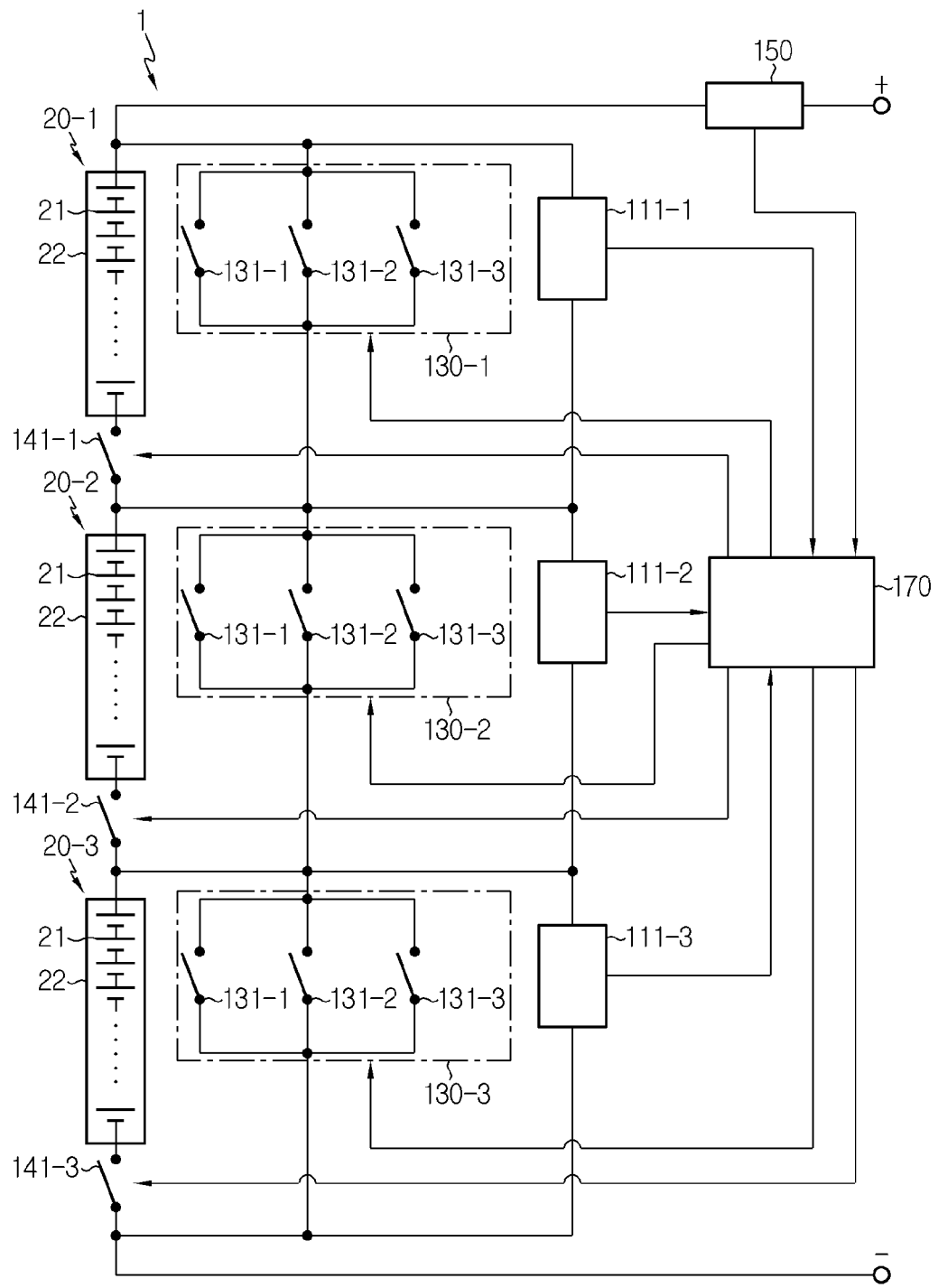

FIG. 9 shows another implementation example of the battery pack 1 shown in FIG. 1, and FIGS. 10 to 13 are diagrams for reference in describing the operation of an overcharge prevention apparatus according to the implementation example shown in FIG. 9. For convenience of description, assume that each bypass circuit 130 is configured as in FIG. 3, and all the bypass switches 131 have the same resistance value R. When compared with the implementation example shown in FIG. 8, an only difference is that the overcharge prevention apparatus 100 according to the implementation example shown in FIG. 9 further includes the current measuring unit 150. Accordingly, like reference numerals refer to like elements throughout, and a repeated description thereof is omitted herein.

The controller 170 controls the disconnect switch 141 connected in series to each cell stack 20 determined to be second overcharge state into OFF state. On the contrary, the controller 170 controls the disconnect switch 141 connected in series to each cell stack 20 not determined to be second overcharge state into ON state. The cell stack 20 connected in series to the disconnect switch 141 having OFF state, i.e., the cell stack 20 in second overcharge state is completely electrically separated from the high current path.

Referring to FIG. 9, the current measuring unit 150 is installed on the high current path, and is connected to the controller 170 allowing communication. The current measuring unit 150 measures the magnitude of charge current, and generates a second monitoring signal indicating the measured charge current. The second monitoring signal is transmitted to the controller 170.

The controller 170 calculates an internal resistance value of at least one of the plurality of cell stacks 20 based on the first monitoring signal from the voltage measuring unit 110 and the second monitoring signal from the current measuring unit 150. Preferably, the controller 170 may calculate the internal resistance value of each cell stack 20 while each cell stack 20 is in unovercharge state. Additionally, the controller 170 periodically updates the internal resistance value of each cell stack 20. Technique to calculate the internal resistance value is well known in the art, and its detailed description is omitted herein.

Additionally, among the plurality of bypass switches 131-1~131-3 connected in parallel to each cell stack 20 in second overcharge state, the controller 170 controls only the number of bypass switches 131 corresponding to the internal resistance value of the cell stack 20 in second overcharge state into ON state.

Figure 10:
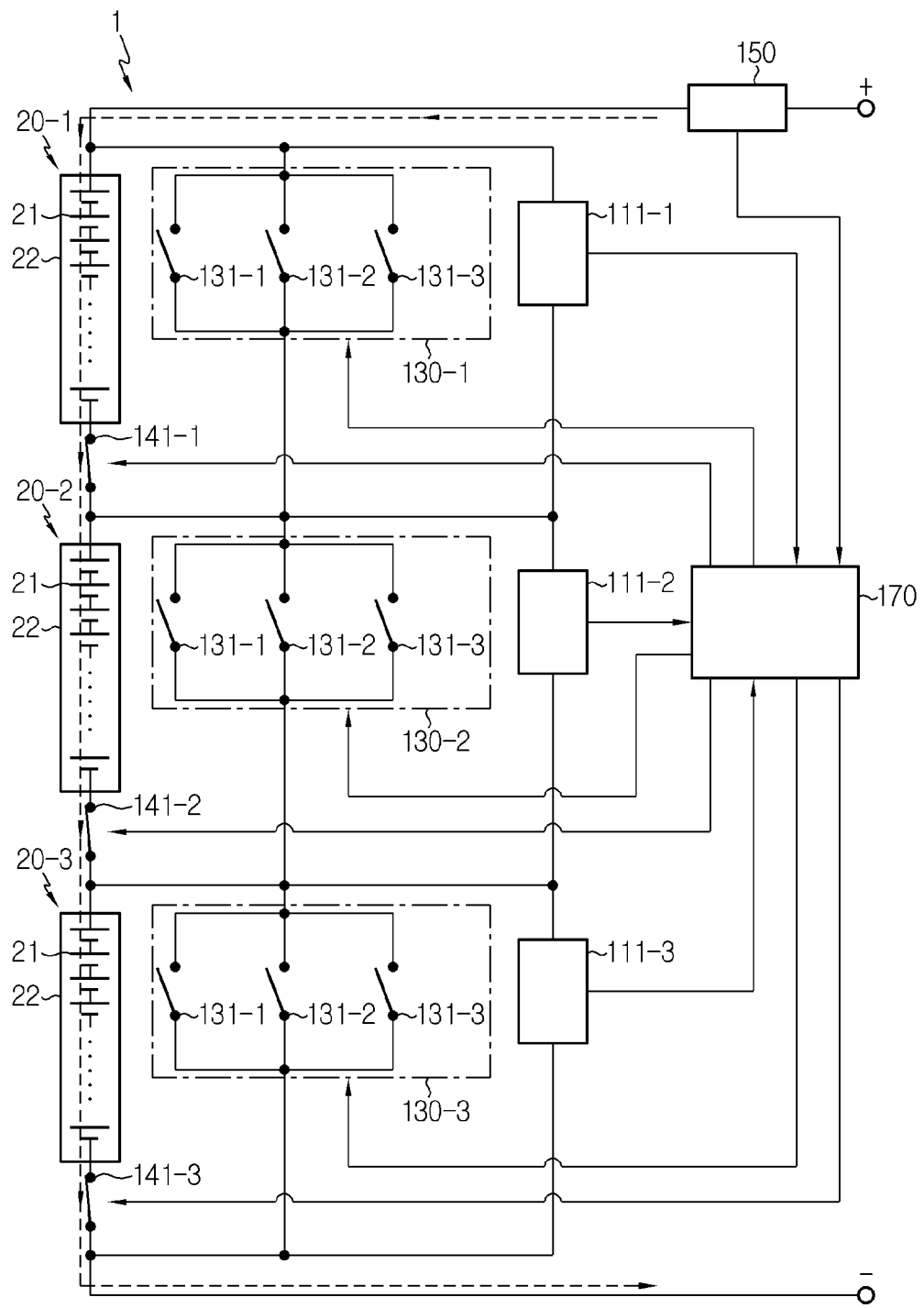
FIGS. 10 to 13 are diagrams for reference in describing the operation of an overcharge prevention apparatus according to the implementation example shown in FIG. 9.

First, FIG. 10 illustrates the operation when the first to third cell stacks 20 are not overcharged. In this case, the controller 170 controls the current regulating unit 120 to turn off all the bypass switches 131 of the first to third bypass circuits 130-1~130-3. Along with this, the controller 170 controls all the disconnect switches 141 included in the disconnecting unit 140 into ON. Accordingly, even a single bypass path is not provided into the battery pack 1 and even a single cell stack 20 is not electrically separated from the high current path, and thus the full charge current is supplied to each cell stack 20 in a sequential order.

Meanwhile, when at least one of the first to third cell stacks 20 is determined to be in second overcharge state, the controller 170 controls the bypass circuit 130 connected in parallel to each cell stack 20 in second overcharge state, based on the internal resistance value of each cell stack 20 in second overcharge state.

Figure 11:
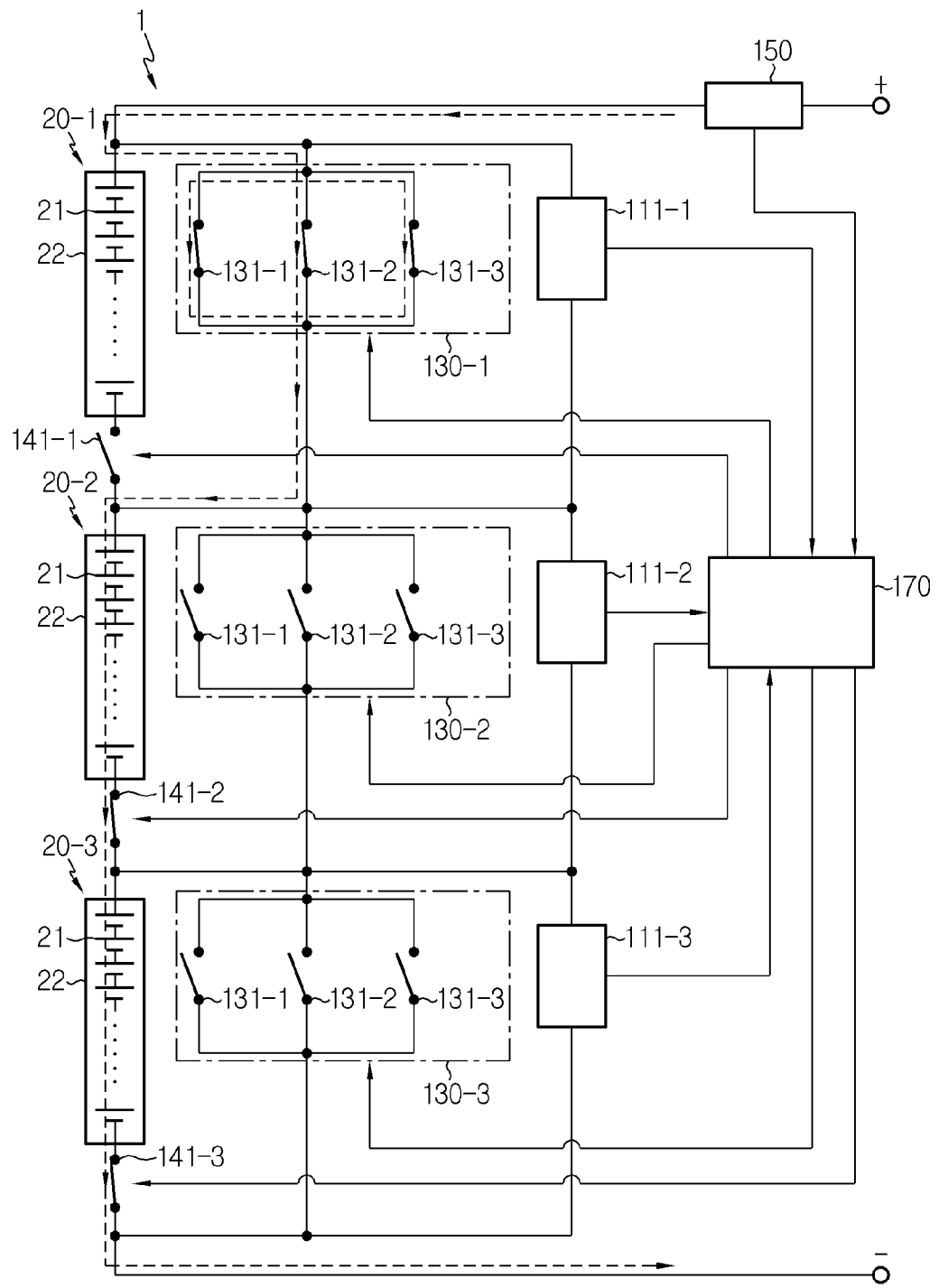

FIG. 11 illustrates the operation when only the first cell stack 20-1 is determined to be in second overcharge state, and the second and third cell stacks 20-2, 20-3 are not determined to be in first and second overcharge states. The controller 170 controls a first disconnecting switch 141-1 into OFF state, and controls second and third disconnect switches 141-2, 141-3 into ON state. Accordingly, only the first cell stack 20-1 is completely electrically separated from the high current path. That is, the charge current is not supplied to the first cell stack 20-1.

Along with this, the controller 170 controls one or more bypass switches 131 included in the first bypass circuit 130-1 into ON state based on the latest calculated internal resistance of the first cell stack 20-1. In this instance, the controller 170 may reduce the number of bypass switches 131 to control into ON state, as the internal resistance value of the first cell stack 20-1 is larger.

Let us assume Ra<Rb. When the internal resistance value of the first cell stack 20-1 is smaller than Ra, the controller 170 controls all the bypass switches 131-1~131-3 included in the first bypass circuit 130-1 into ON state as shown in FIG. 11. In this case, the resistance value of the first bypass path is R/3. When the internal resistance value of the first cell stack 20-1 is larger than Ra and smaller than Rb, the controller 170 controls any two bypass switches (e.g., 131-1, 131-2) included in the first bypass circuit 130-1 into ON state, and one remaining bypass switch (e.g., 131-3) into OFF state. In this case, the resistance value of the bypass path provided to the first cell stack 20-1 is R/2. When the internal resistance value of the first cell stack 20-1 is larger than Rb, the controller 170 controls only one bypass switch (e.g., 131-1) included in the first bypass circuit 130-1 into ON state, and the remaining bypass switches (e.g., 131-2, 131-3) into OFF state. In this case, the resistance value of the first bypass path is R.

That is, with the increasing resistance value of each cell stack 20 having second overcharge state, the controller 170 increases the resistance value of the bypass path provided to each cell stack 20 having second overcharge state, to reduce the magnitude of the charge current supplied to the remaining cell stack 20 that is not overcharged.

Figure 12:
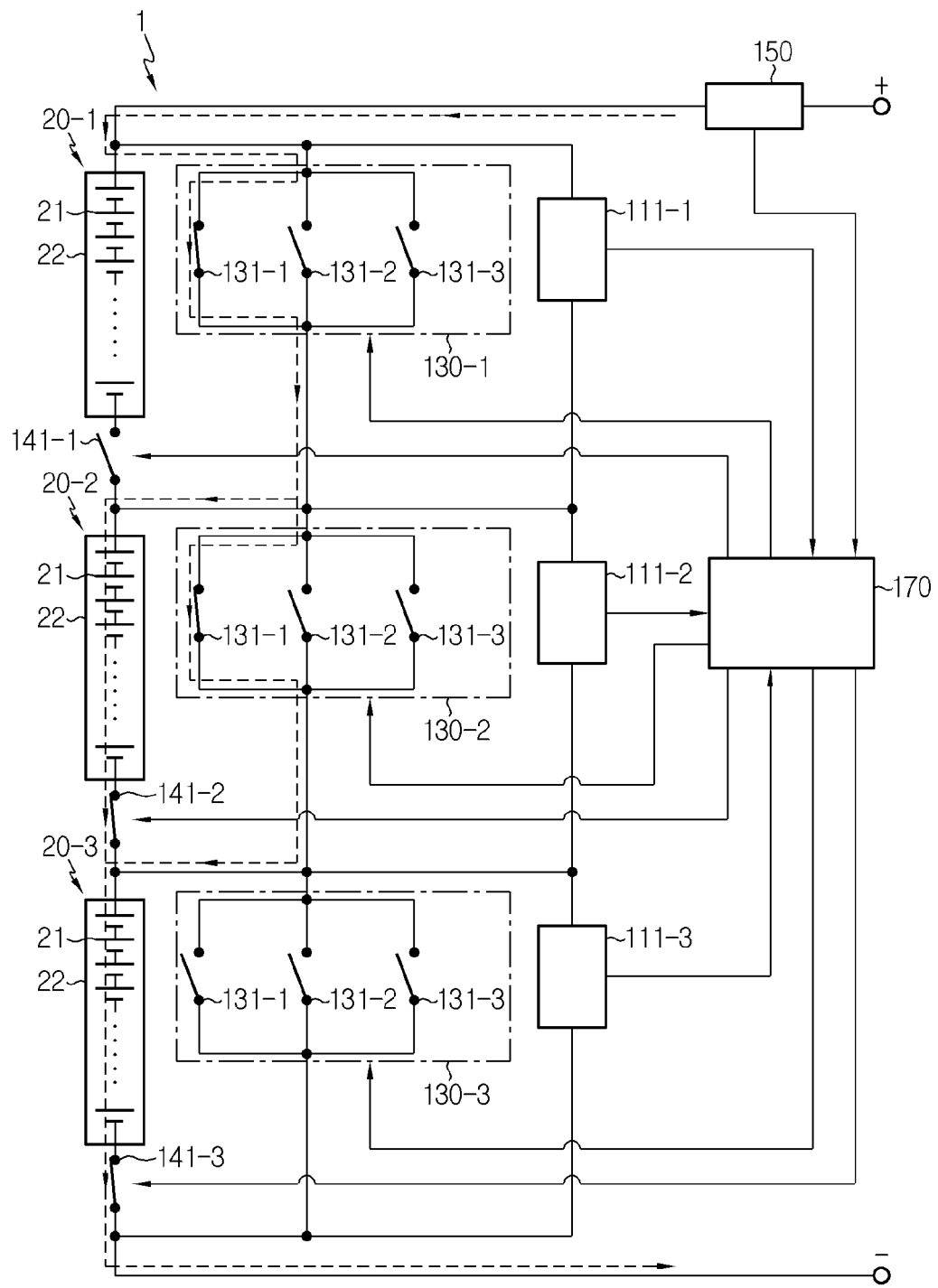

FIG. 12 illustrates the case in which the first cell stack 20-1 is determined to be in second overcharge state and the second cell stack 20-2 to be in first overcharge state, and the third cell stack 20-3 is not overcharged. For convenience of description, assume that the internal resistance value of the first cell stack 20-1 is larger than Rb.

The controller 170 controls only one bypass switch (e.g., 131-1) of the first bypass circuit 130-1 into ON state so that the resistance value of the bypass path provided to the first cell stack 20-1 having the internal resistance value larger than Rb is closest to the internal resistance value of the first cell stack 20-1.

Additionally, the controller 170 controls one or more bypass switches (e.g., 131-1) of the second bypass circuit 130-2 into ON state so that only part of the charge current is supplied to the second cell stack 20-2.

Accordingly, part of the charge current flows through the second and third cell stacks 20-2, 20-3, and the remaining charge current flows through two bypass paths provided to the first and second cell stacks 20-1, 20-2.

Meanwhile, because the plurality of cell stacks is connected in series, when some cell stacks 20 are completely electrically separated from the high current path, the charge current may focus on the remaining cell stacks 20. For example, when the second reference voltage is 21V and the voltage of the first to third cell stacks 20-1~20-3 is respectively measured to be 22V, 20V, 18V, the first cell stack 20-1 is determined to be in second overcharge state, and is electrically separated from the high current path. In this case, an abrupt rise of the charge current as much as 22V of the first cell stack 20-1 may instantaneously occur, causing damage to the second and third cell stacks 20-2, 20-3.

Accordingly, the overcharge prevention apparatus 100 needs to operate to prevent the charge current beyond a predefined value from being supplied to each cell stack 20 that is not in second overcharge state.

Figure 13:
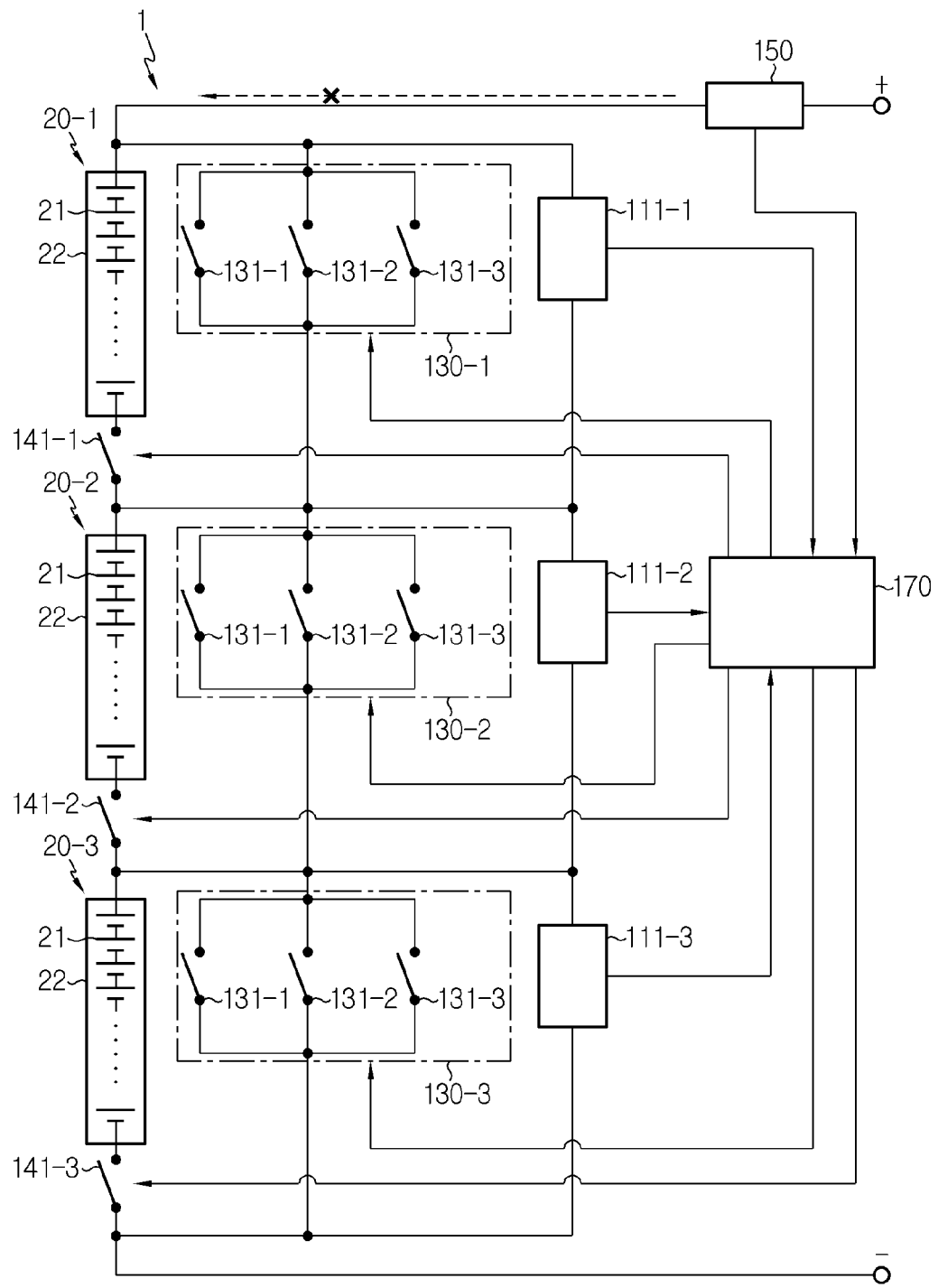

FIG. 13 illustrates the operation when the first and second cell stacks 20-1, 20-2 are determined to be in second overcharge state, and the third cell stack 20-3 is not determined to be in second overcharge state. In this instance, the third cell stack 20-3 may be in first overcharge state or unovercharge state.

The controller 170 may predict a minimum value of the charge current to be supplied to the third cell stack 20-3 that is not in second overcharge state when the first and second cell stacks 20-1, 20-2 in second overcharge state are electrically separated from the high current path, based on the second monitoring signal from the current measuring unit 150. Here, the minimum value of the charge current to be supplied to the third cell stack 20-3 corresponds to the magnitude of the current flowing while the resistance values of each bypass path provided to the first and second cell stacks 20-1, 20-2 are adjusted to a maximum value.

When the minimum value of the charge current to be supplied to the third cell stack 20-3 that is not in second overcharge state is predicted to exceed the predefined value, the controller 170 controls the first and second disconnect switches 141-1, 141-2 as well as the third disconnect switch 141-3 into OFF state. Along with this, the controller 170 controls all the bypass switches 131 included in the first to third bypass circuits 130-1~130-3 into OFF state.

Accordingly, as in FIG. 13, the first and second cell stacks 20-1, 20-2 as well as the third cell stack 20-3 is completely electrically separated from the high current path, and even a single bypass path is not provided. That is, the charge current is shut off inside the battery pack 1.

Figure 14:
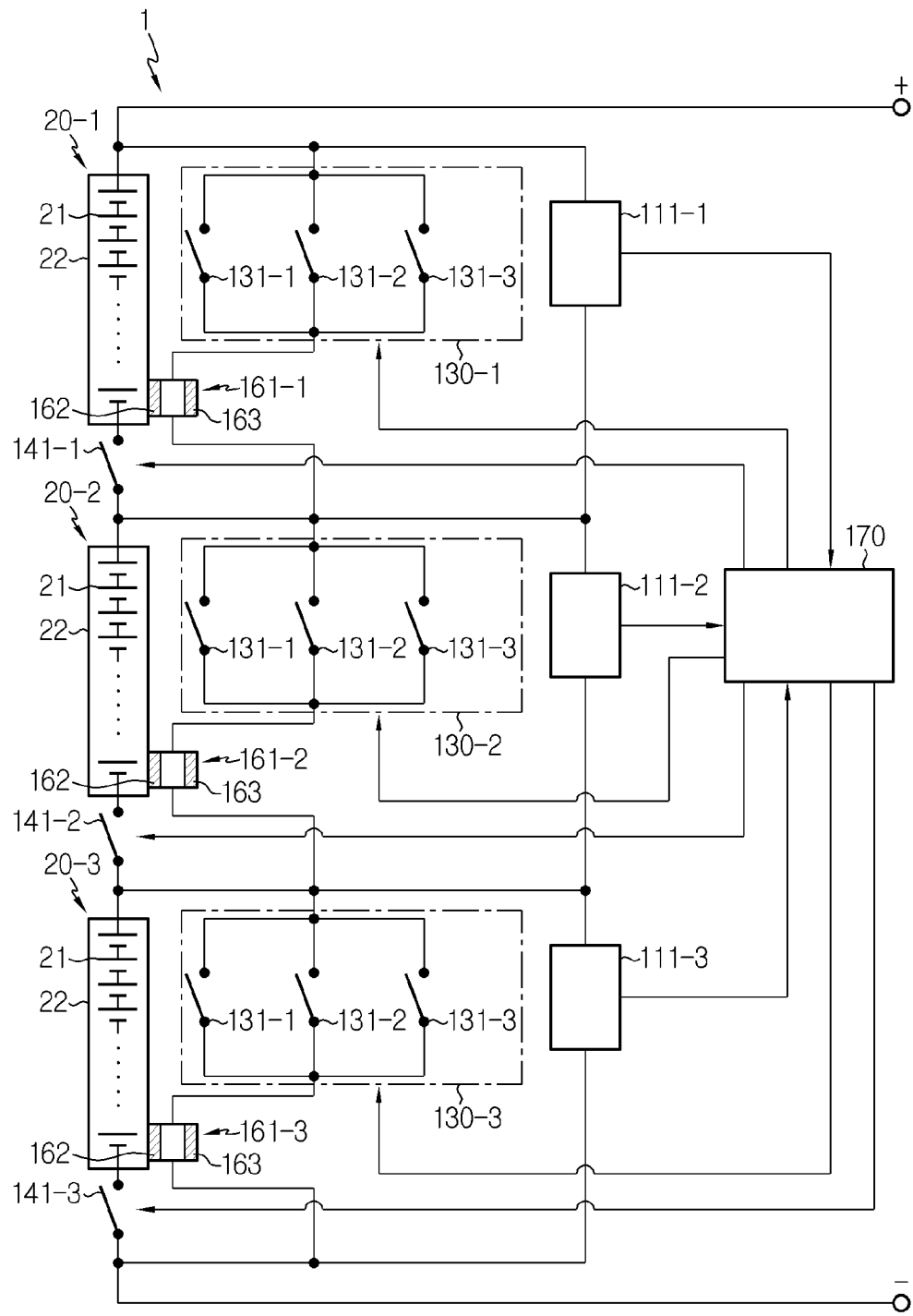
FIGS. 14 to 16 show different implementation examples of the battery pack shown in FIG. 1.

FIG. 14 shows another implementation example of the battery pack 1 shown in FIG. 1. The overcharge prevention apparatus 100 according to the implementation example shown in FIG. 14 may further include the cooling unit 160 in addition to the implementation example shown in FIG. 2, 8 or 9. The cooling unit 160 is configured to cool one cell stack 20 or two or more cell stacks 20 included in the battery pack 1 simultaneously or individually. Like reference numerals refer to like elements throughout, and a repeated description thereof is omitted herein.

The implementation example shown in FIG. 14 illustrates the overcharge prevention apparatus 100 further including the cooling unit 160 in addition to the implementation example shown in FIG. 8.

The cooling unit 160 includes a plurality of cooling elements 161. Each cooling element 161 is connected in series to each bypass circuit 130. Specifically, a circuit having one bypass circuit 130 and one cooling element 161 connected in series is connected in parallel to each cell stack 20. Alternatively, a circuit having one bypass circuit 130 and one cooling element 161 connected in series is connected in parallel to a circuit having one cell stack 20 and one disconnect switch 141 connected in series. Accordingly, each cooling element 161 forms part of each bypass path, and operates by the charge current.

Preferably, the cooling element 161 is a Peltier element. Referring to FIG. 14, each Peltier element 161 has a heat absorbing part 162 and a heat emitting part 163. While the Peltier effect works, heat absorbed into the heat absorbing part 162 goes out through the heat emitting part 163. Accordingly, for cooling of each cell stack 20, the heat absorbing part 162 of each Peltier element may be placed closer to each cell stack 20 than the heat emitting part 163. For example, the heat absorbing part 162 of each Peltier element may come into contact with the case 22 of each cell stack 20 at least in part.

In general, the voltage and temperature of the cell stack 20 is approximately proportional.

Each bypass path is only provided to the overcharged cell stack 20, and each Peltier element 161 generates the Peltier effect only when the charge current flows through the bypass path on which the Peltier element 161 is installed. Accordingly, the heat absorbing part 162 of each Peltier element 161 absorbs heat from the overcharged cell stack 20, thereby preventing the overcharged cell stack 20 from generating heat.

Meanwhile, the cooling element 161 is not limited to the Peltier element, and may be replaced with a cooling fan. When the cooling element 161 is a cooling fan, the cooling fan rotates using the charge current supplied through the bypass path on which the cooling fan is installed, to provide a cooling medium such as air to each cell stack 20.

Meanwhile, while the charge power is not connected to the battery pack 1, the controller 170 selectively controls each bypass circuit 130 based on the first monitoring signal to reduce the state of charge (SOC) of each overcharged cell stack 20, thereby reducing a voltage difference between the plurality of cell stacks 20. That is, the current regulating unit 120 may perform the voltage balancing operation for the plurality of cell stacks 20.

Figure 15:
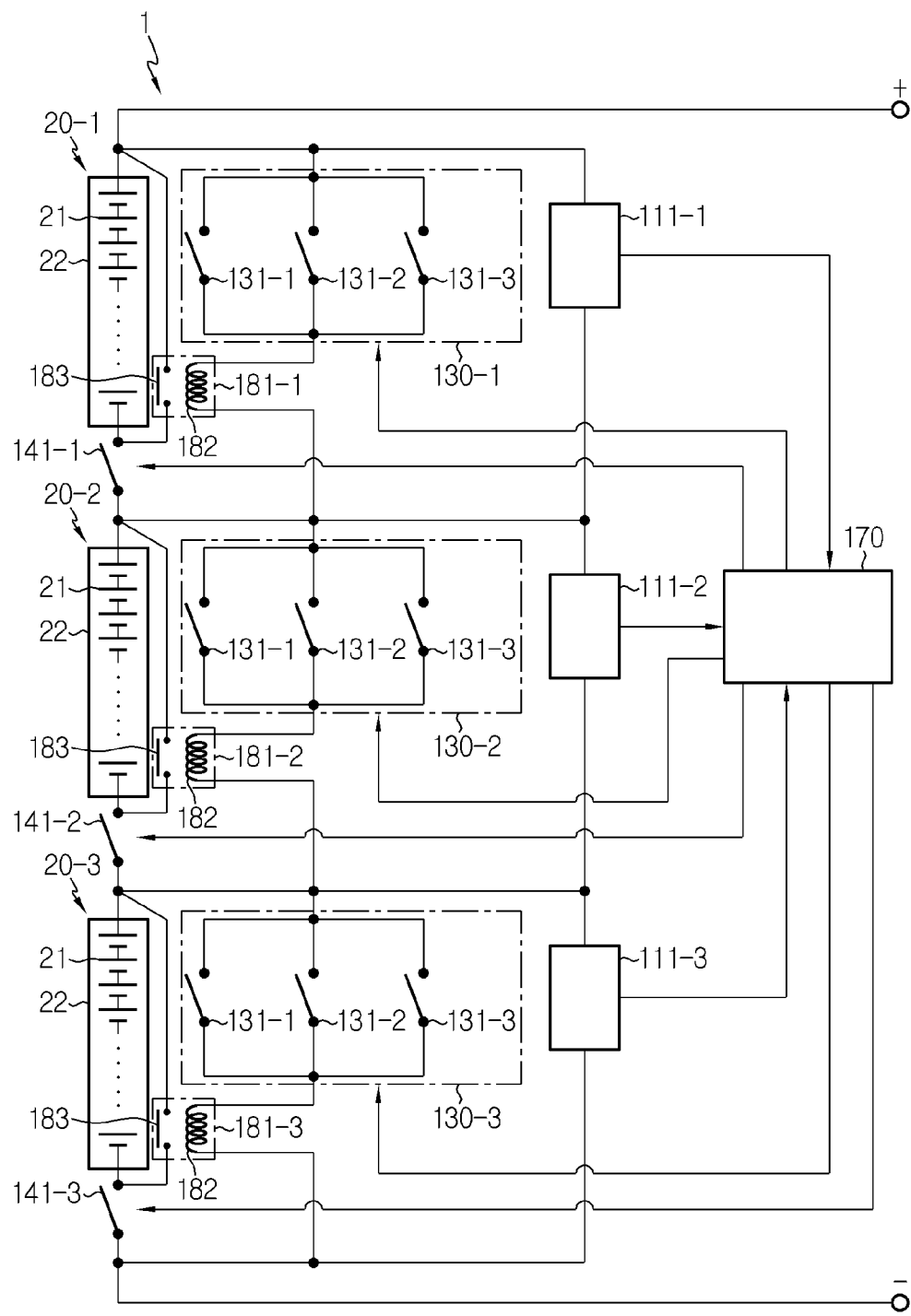

FIG. 15 shows another implementation example of the battery pack 1 shown in FIG. 1. The overcharge prevention apparatus 100 according to the implementation example shown in FIG. 15 may further include a plurality of magnetic contactors 181 in addition to the implementation example shown in FIG. 8, 9 or 14. The plurality of magnetic contactors 181 is included in the discharge inducing unit 180.

The implementation example shown in FIG. 15 illustrates the overcharge prevention apparatus 100 having the plurality of magnetic contactors 181 added to the implementation example shown in FIG. 8. Preferably, the number of magnetic contactors 181 may be the same as the number of cell stacks 20 so that one magnetic contactor 181 corresponds to one cell stack 20. That is, a first magnetic contactor 181-1 corresponds to the first cell stack 20-1, a second magnetic contactor 181-2 corresponds to the second cell stack 20-2, and a third magnetic contactor 181-3 corresponds to the third cell stack 20-3.

Specifically, the first magnetic contactor 181-1 provides a discharge path to the first cell stack 20-1 at least temporarily for the period during which the first cell stack 20-1 is electrically separated from the high current path. Additionally, the second magnetic contactor 181-2 provides a discharge path to the second cell stack 20-2 at least temporarily for the period during which the second cell stack 20-2 is electrically separated from the high current path. Additionally, the third magnetic contactor 181-3 provides a discharge path to the third cell stack 20-3 at least temporarily for the period during which the third cell stack 20-3 is electrically separated from the high current path.

Each magnetic contactor 181 includes a coil 182 and a contact 183. The contact 183 has a predefined resistance value and is configured to connect in parallel to any one cell stack 20.

Specifically, each coil 182 is installed on the bypass path corresponding to any one cell stack 20. That is, each coil 182 is connected in series to each bypass circuit 130. Each coil 182 is activated while the charge current flows through the bypass path on which the coil 182 is installed, generating magnetism. The larger the magnitude of the charge current flowing through the bypass path, the larger the magnetism generated by the coil 182 installed on the bypass path.

One end of each contact 183 may be connected to a first electrode (e.g., positive electrode) of each cell stack 20, and the other end may be connected to a second electrode (e.g., negative electrode) of each cell stack 20. The contact 183 has OFF state in normal condition (i.e., when the level of magnetic force from the coil 182 is less than a predefined value).

When the magnetic force generated by each coil 182 is equal to or higher than the predefined level, the contact 183 is shifted to ON state by the magnetic force of the coil 182. The discharge path is provided to the cell stack 20 connected in parallel to the contact 183 shifted to ON state.

To help understanding, as in FIG. 11, the operation of the magnetic contactor 181 will be described on the basis of the case in which only the first cell stack 20-1 among the first to third cell stacks 20-1~20-3 is in second overcharge state.

When the first cell stack 20-1 is electrically separated from the high current path, the full charge current flows through the first bypass circuit 130-1 and the coil 182 of the first magnetic contactor 181-1. Accordingly, magnetic force enough to shift the contact 183 of the first magnetic contactor 181-1 to ON state is generated from the coil 182 of the first magnetic contactor 181-1.

In contrast, only part of the charge current flows through the second bypass circuit 130-2, and the charge current does not flow in the third bypass circuit 130-3, and thus magnetic force enough to shift the contact 183 of each of the second and third magnetic contactors 181-2, 181-3 to ON state is not generated from the coil 182 of each of the second and third magnetic contactors 181-2, 181-3. Accordingly, the contact 183 of the second magnetic contactor 181-2 and the contact 183 of the third magnetic contactor 181-3 are maintained in OFF state.

The discharge path is provided to the first cell stack 20-1 by the contact 183 of the first magnetic contactor 181-1 shifted to ON state. In contrast, the discharge path is not provided to the second and third cell stacks 20-2, 20-3.

As a result, while the full charge current flows through the first bypass circuit 130-1 and the coil 182 of the first magnetic contactor 181-1, electrical energy stored in the first cell stack 20-1 is consumed by the contact 183 of the first magnetic contactor 181-1, the voltage of the first cell stack 20-1 slowly drops, and after some time passes, the first cell stack 20-1 is outside the second overcharge state. That is, it is possible to discharge the first cell stack 20-1 and charge the second and third cell stacks 20-2, 20-3 simultaneously.

According to the implementation example of FIG. 15, the discharge path and the bypass path provided to each cell stack 20 electrically separated from the high current path among the plurality of cell stacks 20 are completely isolated from each other by the plurality of magnetic contactors 181. Accordingly, it is possible to simultaneously perform the discharge process of each cell stack 20 electrically separated from the high current path and the charge process of each cell stack 20 not electrically separated from the high current path, independently from each other.

Figure 16:
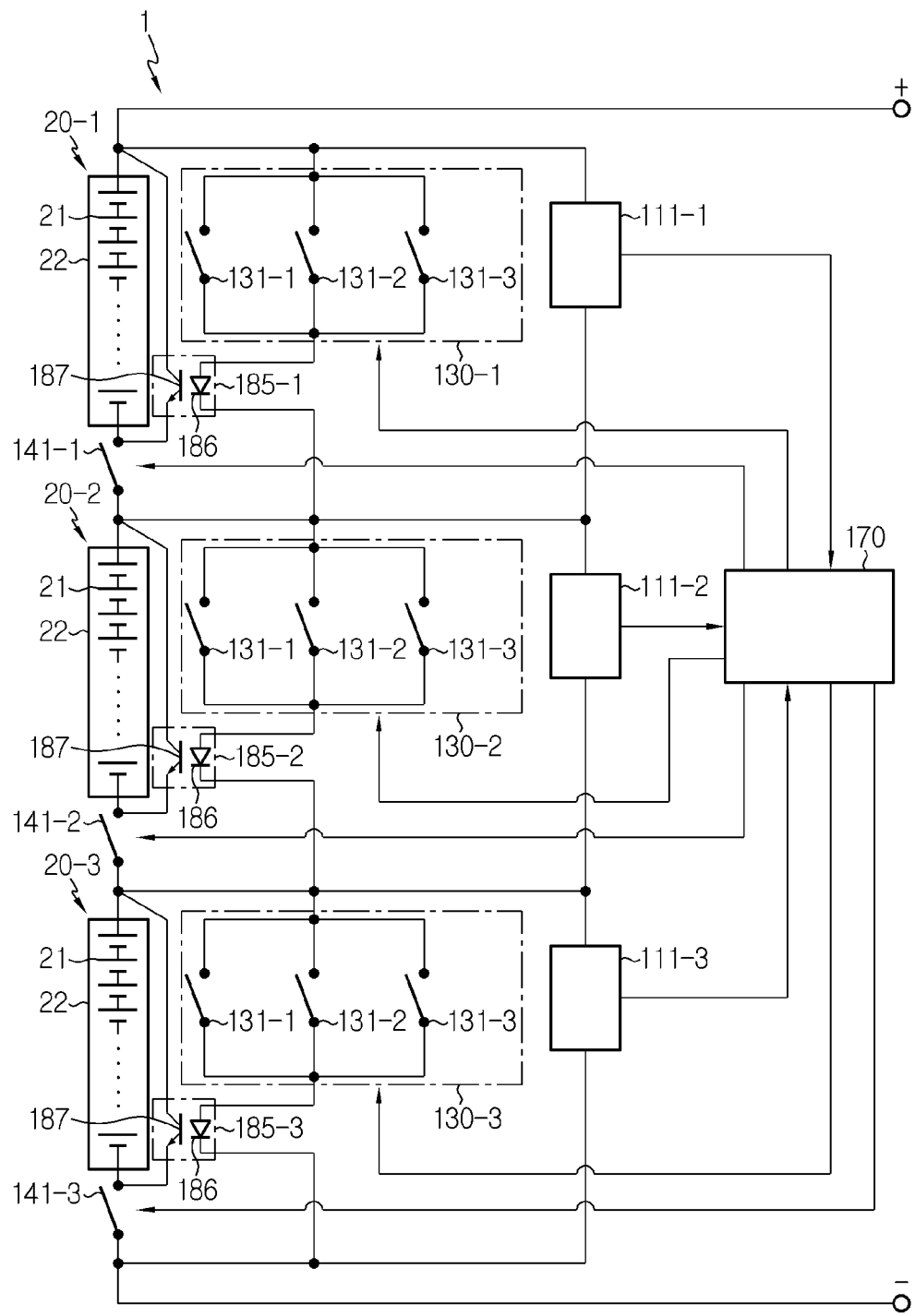

FIG. 16 shows another implementation example of the battery pack 1 shown in FIG. 1. The overcharge prevention apparatus 100 according to the implementation example shown in FIG. 16 may further include a plurality of optocouplers 185 in addition to the implementation example shown in FIG. 8, 9 or 14. The plurality of optocouplers 185 is included in the discharge inducing unit 180.

The implementation example shown in FIG. 16 illustrates the overcharge prevention apparatus 100 having the plurality of optocouplers 185 added to the implementation example shown in FIG. 8. Preferably, the number of optocouplers 185 may be the same as the number of cell stacks 20 so that one optocoupler 185 corresponds to one cell stack 20. That is, a first optocoupler 185-1 corresponds to the first cell stack 20-1, a second optocoupler 185-2 corresponds to the second cell stack 20-2, and a third optocoupler 185-3 corresponds to the third cell stack 20-3.

Specifically, the first optocoupler 185-1 provides a discharge path to the first cell stack 20-1 at least temporarily for the period during which the first cell stack 20-1 is electrically separated from the high current path. Additionally, the second optocoupler 185-2 provides a discharge path to the second cell stack 20-2 at least temporarily for the period during which the second cell stack 20-2 is electrically separated from the high current path. Additionally, the third optocoupler 185-3 provides a discharge path to the third cell stack 20-3 at least temporarily for the period during which the third cell stack 20-3 is electrically separated from the high current path.

Each optocoupler 185 includes a light emitting element 186 and an optical detection element 187. The optical detection element 187 includes a photodiode or a phototransistor. The light emitting element 186 includes gallium, arsenic or a light emitting diode. When compared with the implementation example of FIG. 15, the optical detection element 187 replaces the contact 183, and the light emitting element 186 replaces the coil 182.

Specifically, each light emitting element 186 is installed on the bypass path corresponding to any one cell stack 20. That is, each light emitting element 186 is connected in series to each bypass circuit 130. Each light emitting element 186 is activated while the charge current flows through the bypass path on which the light emitting element 186 is installed, outputting an optical signal. The larger the magnitude of the charge current flowing through the bypass path, the larger the level of the optical signal outputted from the light emitting element 186 installed on the bypass path.

The optical detection element 187 has a predefined resistance value and is configured to connect in parallel to any one cell stack 20. One end of each light detection element 187 may be connected to a first electrode (e.g., positive electrode) of each cell stack 20, and the other end may be connected to a second electrode (e.g., negative electrode) of each cell stack 20. The optical detection element 187 has OFF state in normal condition (i.e., when the level of the optical signal from the light emitting element 186 is less than a predefined value).

When the level of the optical signal outputted from each light emitting element 186 is equal to or larger than the predefined value, the optical detection element 187 is shifted to ON state in response to the optical signal of the light emitting element 186. The discharge path is provided to the cell stack 20 connected in parallel to the optical detection element 187 shifted to ON state.

To help understanding, as in FIG. 11, the operation of the optocoupler 185 will be described on the basis of the case in which only the first cell stack 20-1 among the first to third cell stacks 20-1~20-3 is in second overcharge state.

When the first cell stack 20-1 is electrically separated from the high current path, the full charge current flows through the first bypass circuit 130-1 and the light emitting element 186 of the first optocoupler 185-1. Accordingly, the level of optical signal sufficient to shift the optical detection element 187 of the first optocoupler 185-1 to ON state is outputted from the light emitting element 186 of the first optocoupler 185-1.

In contrast, only part of the charge current flows through the second bypass circuit 130-2 and the charge current does not flow in the third bypass circuit 130-3, and thus the optical signal having the level sufficient to shift the optical detection element 187 each of the second and third optocouplers 185-2, 185-3 to ON state may not be outputted from the light emitting element 186 of each of the second and third optocouplers 185-2, 185-3. Accordingly, the optical detection element 187 of the second optocoupler 185-2 and the optical detection element 187 of the third optocoupler 185-3 are maintained in OFF state.

The discharge path is provided to the first cell stack 20-1 by the optical detection element 187 of the first optocoupler 185-1 shifted to ON state. In contrast, the discharge path is not provided to the second and third cell stacks 20-2, 20-3.

As a result, while the full charge current flows through the first bypass circuit 130-1 and the light emitting element 186 of the first optocoupler 185-1, electrical energy stored in the first cell stack 20-1 is consumed by the optical detection element 187 of the first optocoupler 185-1, the voltage of the first cell stack 20-1 slowly drops, and after some time passes, the first cell stack 20-1 is outside the second overcharge state. That is, it is possible to discharge the first cell stack 20-1 and charge the second and third cell stacks 20-2, 20-3 simultaneously.

According to the implementation example of FIG. 16, the discharge path and the bypass path provided to each cell stack 20 electrically separated from the high current path among the plurality of cell stacks 20 are completely isolated from each other by the plurality of optocouplers 185. Accordingly, in the same way as the implementation example of FIG. 15, it is possible to simultaneously perform the discharge process of each cell stack 20 electrically separated from the the high current path and the charge process of each cell stack 20 not electrically separated from the high current path, independently from each other.

Figure 17:
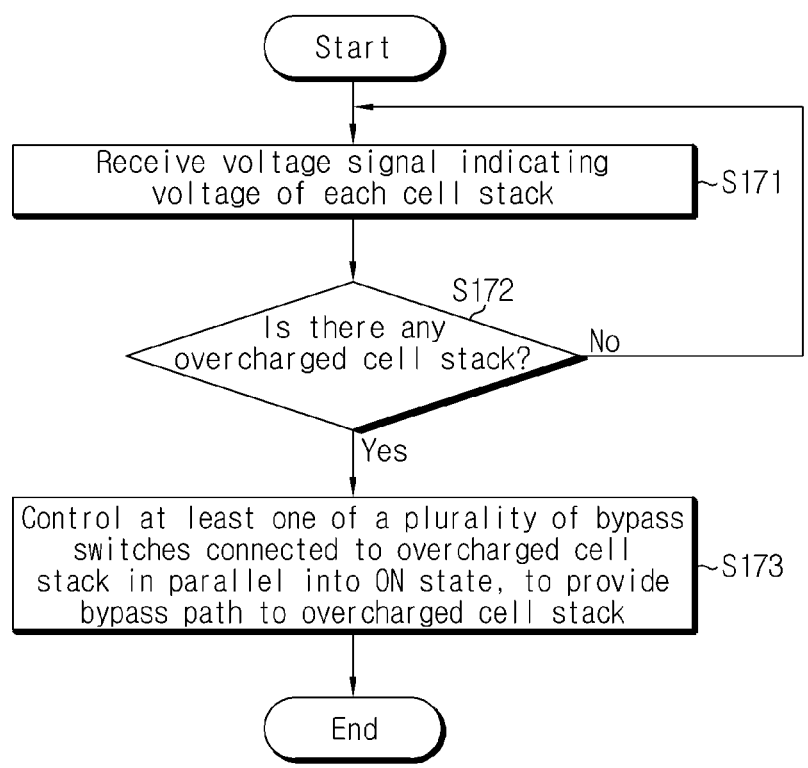
FIG. 17 is a flowchart showing an overcharge prevention method according to another embodiment of the present disclosure.

FIG. 17 is a flowchart showing an overcharge prevention method according to another embodiment of the present disclosure.

Referring to FIG. 17, in S171, the controller 170 receives a first monitoring signal indicating voltage of each cell stack 20. The first monitoring signal received by the controller 170 is outputted from the voltage measuring unit 110.

In S172, the controller 170 determines if there is any overcharged cell stack in the battery pack 1, based on the first monitoring signal. When the result of S152 is "YES", the process moves to S173. In contrast, when the result of S172 is "NO", the process reverts to S171.

In S173, the controller 170 controls at least one of a plurality of bypass switches connected in parallel to the overcharged cell stack into ON state, to provide a bypass path to the overcharged cell stack. In this instance, among the plurality of bypass switches connected in parallel to the overcharged cell stack, the controller 170 may control only the number of bypass switches corresponding to an internal resistance value of the overcharged cell stack into ON state, and the remaining bypass switch into OFF state.

The embodiments of the present disclosure described hereinabove are not implemented only through the apparatus and method, and may be implemented through programs that realize functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. An overcharge prevention apparatus for preventing an overcharge of a plurality of cell stacks connected in series within a high current path, the overcharge prevention apparatus comprising:
    a voltage measuring unit configured to measure a voltage of each cell stack, and generate a first monitoring signal indicating the measured voltage of each cell stack;
    a current regulating unit configured to selectively provide a respective bypass path to each cell stack, wherein the current regulating unit includes a plurality of bypass circuits, each bypass circuit corresponding to a respective cell stack; and
    a controller connected to the voltage measuring unit and connected to the plurality of bypass circuits of the current regulating unit,
    wherein the controller is configured to control the plurality of bypass circuits of the current regulating unit based on the first monitoring signal from the voltage measuring unit,
    wherein each bypass circuit includes a plurality of bypass switches connected in parallel to one another and in parallel to the corresponding cell stack, and
    wherein each bypass circuit further includes a plurality of resistors, each of the plurality of resistors connected in series to a corresponding bypass switch of the bypass circuit.

2. The overcharge prevention apparatus according to claim 1, wherein the controller is configured to:
    determine if any of the plurality of cell stacks is overcharged, based on the first monitoring signal from the voltage measuring unit, and
    when there is an overcharged cell stack, control the current regulating unit to provide a bypass path to the overcharged cell stack.

3. The overcharge prevention apparatus according to claim 1 wherein the controller is configured to:
    determine if any of the plurality of cell stacks is overcharged, based on the first monitoring signal from the voltage measuring unit, and
    when there is an overcharged cell stack, control at least one of the plurality of bypass switches connected in parallel to the overcharged cell stack into an ON state.

4. The overcharge prevention apparatus according to claim 3, further comprising:
    a current measuring unit configured to measure a charge current supplied to each cell stack, and generate a second monitoring signal indicating the measured charge current.

5. The overcharge prevention apparatus according to claim 4, wherein the controller is configured to calculate an internal resistance value of at least one of the plurality of cell stacks based on the first monitoring signal from the voltage measuring unit and the second monitoring signal from the current measuring unit.

6. The overcharge prevention apparatus according to claim 5, wherein for the plurality of bypass switches connected in parallel to the overcharged cell stack, the controller is configured to control a number of the plurality of bypass switches corresponding to the internal resistance value of the overcharged cell stack into the ON state and maintain a remaining number of the bypass switches in an OFF state.

7. The overcharge prevention apparatus according to claim 1, further comprising:
    a cooling unit including a plurality of cooling elements, each cooling element configured to cool a corresponding cell stack,
    wherein each cooling element is powered by a charge current supplied through the bypass path of the corresponding cell stack.

8. The overcharge prevention apparatus according to claim 7, wherein each cooling element is a Peltier element having a heat absorbing part and a heat emitting part, the heat absorbing part being positioned closer to each cell stack than the heat emitting part.

9. The overcharge prevention apparatus according to claim 1, wherein the voltage measuring unit includes a plurality of voltage sensors, each voltage sensor connected in parallel to a corresponding cell stack.

10. A battery pack comprising:
    the overcharge prevention apparatus according to claim 1; and
    a plurality of cell stacks connected in series,
    wherein the overcharge prevention apparatus is configured to perform an overcharge prevention operation for each cell stack.

11. The overcharge prevention apparatus according to claim 1, wherein the controller is configured to control a magnitude of charge current supplied to each cell stack by controlling the plurality of bypass switches in each corresponding bypass circuit, whereby an increase in a number of bypass switches of a bypass circuit controlled into an ON state corresponds to a decrease in the magnitude of charge current supplied to the corresponding cell stack.

12. An overcharge prevention apparatus for preventing an overcharge of a plurality of cell stacks connected in series within a high current path, the overcharge prevention apparatus comprising:
    a voltage measuring unit configured to measure a voltage of each cell stack, and generate a first monitoring signal indicating the measured voltage of each cell stack;
    a current regulating unit configured to selectively provide a respective bypass path to each cell stack;
    a controller connected to the voltage measuring unit and the current regulating unit, wherein the controller is configured to control the current regulating unit based on the first monitoring signal from the voltage measuring unit; and
    a cooling unit including a plurality of cooling elements, each cooling element configured to cool a corresponding cell stack, wherein each cooling element is powered by a charge current supplied through the bypass path of the corresponding cell stack.

13. The overcharge prevention apparatus according to claim 12, wherein each cooling element is a Peltier element having a heat absorbing part and a heat emitting part, the heat absorbing part being positioned closer to each cell stack than the heat emitting part.

14. A battery pack comprising:
    the overcharge prevention apparatus according to claim 12; and
    a plurality of cell stacks connected in series,
    wherein the overcharge prevention apparatus is configured to perform an overcharge prevention operation for each cell stack.

15. An overcharge prevention apparatus for preventing an overcharge of a plurality of cell stacks connected in series within a high current path, the overcharge prevention apparatus comprising:
    a voltage measuring unit configured to measure a voltage of each cell stack, and generate a first monitoring signal indicating the measured voltage of each cell stack;
    a current regulating unit configured to selectively provide a respective bypass path to each cell stack, wherein the current regulating unit includes a plurality of bypass circuits, each bypass circuit corresponding to a respective cell stack, and wherein each bypass circuit includes a plurality of bypass switches connected in parallel to each cell stack;

a current measuring unit configured to measure a charge current supplied to each cell stack, and generate a second monitoring signal indicating the measured charge current; and a controller connected to the voltage measuring unit and the current regulating unit, wherein the controller is configured to:
  control the current regulating unit based on the first monitoring signal from the voltage measuring unit;
  determine if any of the plurality of cell stacks is overcharged, based on the first monitoring signal from the voltage measuring unit;
  when there is an overcharged cell stack, control at least one of the plurality of bypass switches connected in parallel to the overcharged cell stack into an ON state; and
  calculate an internal resistance value of at least one of the plurality of cell stacks based on the first monitoring signal from the voltage measuring unit and the second monitoring signal from the current measuring unit.

16. The overcharge prevention apparatus according to claim 15, wherein for the plurality of bypass switches connected in parallel to the overcharged cell stack, the controller is configured to control a number of the plurality of bypass switches corresponding to the internal resistance value of the overcharged cell stack into the ON state and maintain a remaining number of the bypass switches in an OFF state.

17. A battery pack comprising:
  the overcharge prevention apparatus according to claim 15; and
  a plurality of cell stacks connected in series,
  wherein the overcharge prevention apparatus is configured to perform an overcharge prevention operation for each cell stack.

* * * * *